United States Patent
Erlbacher et al.

(10) Patent No.: US 10,186,734 B2
(45) Date of Patent: Jan. 22, 2019

(54) DEVICE AND METHOD FOR BRIDGING AN ELECTRICAL ENERGY STORAGE

(71) Applicant: Fraunhofer-Gesellschaft zur Foerderung der angewandten Forschung e.V., Munich (DE)

(72) Inventors: Tobias Erlbacher, Poxdorf (DE); Vincent Lorentz, Erlangen (DE); Reinhold Waller, Neunkirchen am Brand (DE); Gudrun Rattmann, Heroldsbach (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 491 days.

(21) Appl. No.: 14/719,831

(22) Filed: May 22, 2015

(65) Prior Publication Data
US 2015/0357680 A1    Dec. 10, 2015

(30) Foreign Application Priority Data
May 23, 2014    (DE) .................. 10 2014 107 287

(51) Int. Cl.
*H01L 29/00* (2006.01)
*H01M 10/42* (2006.01)
(Continued)

(52) U.S. Cl.
CPC ......... *H01M 10/425* (2013.01); *B60L 3/0046* (2013.01); *B60L 3/04* (2013.01);
(Continued)

(58) Field of Classification Search
CPC ........... H01M 10/425; H01M 10/4207; H01M 2220/30; H01M 220/103;
(Continued)

(56) References Cited

U.S. PATENT DOCUMENTS

| 4,879,188 A | 11/1989 | Meinhold et al. |
| 2006/0065891 A1 | 3/2006 | McCormack et al. |

(Continued)

FOREIGN PATENT DOCUMENTS

| DE | 1539092 A1 | 4/1970 |
| DE | 2316599 A1 | 10/1973 |

(Continued)

OTHER PUBLICATIONS

"The Antifuse", Portions from Application-Specific Integrated Circuits, Available online at http://iroi.seu.edu.cn/books/asics/Book2/CH04/CH04.1.htm, 1997.

(Continued)

*Primary Examiner* — Cynthia H Kelly
*Assistant Examiner* — Monique M Wills
(74) *Attorney, Agent, or Firm* — Murphy, Bilak & Homiller, PLLC

(57) ABSTRACT

A semiconductor substrate has a first doping region arranged at a surface and a second doping region adjacent to the first doping region. A p-n junction between the doping regions is at least partially arranged less than 5 μm away from a contact area of the first doping region arranged at the substrate surface. A first contact structure is in contact with the first doping region in the contact area of the first doping region and has at least partially an electrically conductive material provided for a diffusion into the semiconductor substrate. The first contact structure is configured so that the conductive material provided for a diffusion into the substrate diffuses at least partially through the first doping region into the second doping region in case predefined trigger conditions occur. A second contact structure is in contact with the second doping region in a contact area of the second doping region.

19 Claims, 12 Drawing Sheets

(51) Int. Cl.
| | |
|---|---|
| *H01L 29/861* | (2006.01) |
| *H01L 29/45* | (2006.01) |
| *H01L 29/06* | (2006.01) |
| *H01L 23/525* | (2006.01) |
| *H01L 29/36* | (2006.01) |
| *H01L 23/532* | (2006.01) |
| *H01L 29/417* | (2006.01) |
| *B60L 3/00* | (2006.01) |
| *B60L 3/04* | (2006.01) |
| *B60L 11/18* | (2006.01) |
| *H01L 29/16* | (2006.01) |
| *H01L 29/20* | (2006.01) |
| *H01M 2/34* | (2006.01) |

(52) U.S. Cl.
CPC ...... *B60L 11/1879* (2013.01); *H01L 23/5256* (2013.01); *H01L 23/53214* (2013.01); *H01L 29/0684* (2013.01); *H01L 29/0688* (2013.01); *H01L 29/36* (2013.01); *H01L 29/417* (2013.01); *H01L 29/45* (2013.01); *H01L 29/452* (2013.01); *H01L 29/456* (2013.01); *H01L 29/861* (2013.01); *H01L 29/8611* (2013.01); *H01M 10/4207* (2013.01); *H01L 23/5252* (2013.01); *H01L 29/1608* (2013.01); *H01L 29/20* (2013.01); *H01L 2924/0002* (2013.01); *H01M 2/348* (2013.01); *H01M 2200/103* (2013.01); *H01M 2220/20* (2013.01); *H01M 2220/30* (2013.01); *Y02T 10/705* (2013.01); *Y02T 10/7005* (2013.01)

(58) Field of Classification Search
CPC ........ H01M 2200/103; H01M 2220/20; H01L 29/45; H01L 29/0688; H01L 23/53214; H01L 29/417; H01L 29/456; H01L 29/36; H01L 2/348; Y02T 10/705
See application file for complete search history.

(56) References Cited

U.S. PATENT DOCUMENTS

| | | | |
|---|---|---|---|
| 2010/0052149 A1* | 3/2010 | Nose | H01L 23/49503 257/692 |
| 2010/0244194 A1 | 9/2010 | Masada et al. | |
| 2011/0265859 A1* | 11/2011 | Safir | H01L 27/142 136/249 |
| 2013/0057991 A1* | 3/2013 | Chatty | H01L 29/7436 361/56 |
| 2013/0252039 A1 | 9/2013 | Vom Dorp et al. | |

FOREIGN PATENT DOCUMENTS

| | | |
|---|---|---|
| DE | 3426199 A1 | 1/1986 |
| DE | 3542838 A1 | 6/1987 |
| DE | 3721754 A1 | 1/1989 |
| DE | 3743773 A1 | 7/1989 |
| DE | 19723747 C1 | 11/1998 |
| DE | 19849902 A1 | 5/2000 |
| DE | 102009000676 A1 | 8/2010 |
| DE | 102009047439 A1 | 6/2011 |
| DE | 102012005979 B4 | 11/2013 |
| EP | 0226360 A2 | 6/1987 |
| EP | 0989611 A2 | 3/2000 |
| EP | 1389802 A1 | 2/2004 |
| GB | 1086830 A | 10/1967 |
| WO | 2011067023 A1 | 6/2011 |

OTHER PUBLICATIONS

Erlbacher, et al., "Feasibility and Limitations of Anti-Fuses Based on Bistable Non-Volatile Switches for Power Electronic Applications", Solid-State Electronics 75 (2012) 33-36.
Köhler, et al., "High Performance Nickel-Metal Hydride and Lithium-Ion Batteries", Journal of Power Sources 105 (2002) 139-144.
Xing, et al., "Battery Management Systems in Electric and Hybrid Vehicles", Energies (2011), 4, pp. 1840-1857.
Roig, J., et al., "Improved current filament control during Zener diode zapping", Microelectronics Reliability, vol. 52, 2012, pp. 2368-2373.

* cited by examiner

DEVICE AND METHOD FOR BRIDGING AN ELECTRICAL ENERGY STORAGE

PRIORITY CLAIM

This application claims priority to German Patent Application No. 10 2014 107 287.1 filed on 23 May 2014, the content of said application incorporated herein by reference in its entirety.

TECHNICAL FIELD

Embodiments of the invention relate to protective measures for electrical energy storages and particularly to a device and a method for bridging an electrical energy storage.

BACKGROUND

Energy storages (e.g., rechargeable batteries) can be found in a plurality of devices, such as in mobile systems, electric vehicles, etc. Mobile systems use, for example, electrical energy storage cells connected in series. The significance and number of mobile systems, such as so-called smartphones, tablet computers, notebooks, hybrid/electric vehicles, which become available on the market is increasing year after year. There is a constantly increasing demand for electrical storage means, as electronics play an ever greater role in such mobile systems. In recent years, given the economic and ecological requirements, the automotive industry, for example, came under pressure to introduce hybrid motor vehicles which combine two energy sources, wherein one of the energy sources provides electrical energy. Electrical energy is generally stored in chemical form, such as using battery cells, accumulator cells or capacitor cells. In order to achieve the high voltages and high powers required in motor vehicles with electric drives, several such cells, such as four to more than 100 cells, are connected in series, thus generating a stack of cells. A main challenge of the cells connected in series and/or in parallel is the reliability of the entire stack and the reorganization of the stack in the event of one cell error. It is currently the case that, in the event of a failure of one cell in the stack, the entire system is no longer able to operate, even though the stack as such still comprises a sufficient number of intact cells to enable the system to operate. If the system is a purely electric vehicle—but also in the case of most hybrid vehicles—such a cell error usually results in a complete system failure.

For a reliable operation of electric vehicles, battery management systems are used. Alongside the monitoring of the charging state and "health" of the battery cells, it may be the task of the battery management system to arrange for the battery cells to be balanced. In the event of a single defective (discharged) cell, the entire battery pack may fail. Therefore, it is desirable that such cells are short-circuited using a bridging element connected in parallel and are thus bridged. Here, bridging a healthy/charged cell should be avoided as, in this state, the short-circuited cell may trigger a great temperature rise due to self-discharge.

There is a demand for providing an improved concept for bridging an electrical energy storage which allows to increase reliability and/or operational safety of energy supply systems, and/or to reduce the costs.

SUMMARY

Some embodiments relate to a device for bridging an electrical energy storage. The device comprises a semiconductor substrate with a first doping region arranged at a surface of the semiconductor substrate and a second doping region adjacent to the first doping region. The first doping region comprises a first conductivity type and the second doping region comprises a second conductivity type. The p-n-junction between the first doping region and the second doping region is at least partially arranged less than 5 µm away from a contact area of the first doping region arranged at the surface of the first semiconductor substrate. The device further comprises a first contact structure which is in contact with the first doping region in the contact area of the first doping region and comprises at least partially an electrically conductive material provided for a diffusion into the semiconductor substrate. The first contact structure is implemented so that the electrically conductive material provided for a diffusion into the semiconductor substrate diffuses at least partially through the first doping region into the second doping region in the event of predefined trigger conditions. In addition, the device comprises a second contact structure which is in contact with the second doping region in a contact area of the second doping region.

By using the electrically conductive material provided for a diffusion into the semiconductor substrate in the contact structure of a thin doping region of a diode, the thin doping region may at least be partially short-circuited by alloying in case the predefined trigger conditions occur, and thus a low-resistance current path may be generated. Thus, a bridging element may be realized with a high degree of reliability and/or at a low cost.

Some embodiments relate to a device for bridging an electrical energy storage which comprises a semiconductor diode integrated on a semiconductor chip and a first electrically conductive contact element which is connected to a first contact structure of the semiconductor diode on a front side of the semiconductor chip. The device further comprises a second electrically conductive contact element which is connected to a second contact structure of the semiconductor diode on a backside of the semiconductor chip. Here, a contact area between the second electrically conductive contact element and the backside of the semiconductor chip extends across less than 70% of the area of the backside of the semiconductor chip.

By reducing the contact area between the backside terminal of the bridging element, heat dissipation via the backside terminal can be significantly reduced. Thus, a faster and greater temperature rise can be acquired using less current via the semiconductor diode. For example, in this way, the semiconductor diode may, in a simplified manner, be at least partially short-circuited by alloying and a low-resistance current path may be generated. Hence, the bridging element can be triggered in a simpler, faster and/or more reliable manner.

Further embodiments relate to a method for bridging an electrical energy storage. The method comprises blocking a current flow using a bridging element which comprises a semiconductor substrate with a first doping region arranged at a surface of the semiconductor substrate, and a second doping region adjacent to the first doping region. The first doping region comprises a first conductivity type and the second doping region comprises a second conductivity type. The p-n-junction between the first doping region and the second doping region is at least partially arranged less than 5 µm away from a contact area of the first doping region arranged at the surface of the semiconductor substrate. The bridging element comprises a first contact structure, at least partially provided for a diffusion into the semiconductor substrate and comprising electrically conductive material, which is in contact with the first doping region in the contact area of the first doping region. The method further comprises transferring the bridging element into a conducting state in case predefined trigger conditions occur by at least partially diffusing the electrically conductive material, provided for a diffusion into the semiconductor substrate, through the first doping region into the second doping region.

BRIEF DESCRIPTION OF THE DRAWINGS

Embodiments of the invention will be described in more detail in the following with reference to the accompanying drawing, in which:

FIG. 9 illustrates series-connected energy sources with bridging power elements, wherein

FIG. 11 presents a schematic representation of an inverse fuse, wherein FIG. 11(a) shows the symbols used in FIGS. 3 and 4 for the inverse fuse, and wherein

DETAILED DESCRIPTION

Figure 1:
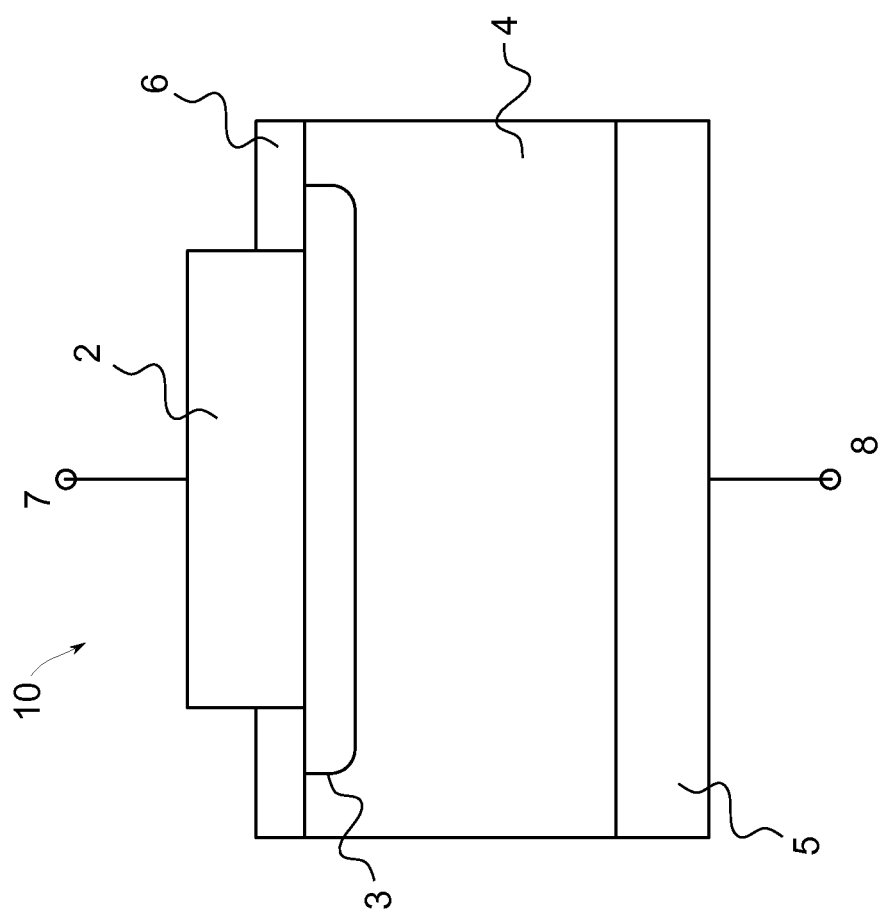
FIG. 1 illustrates a schematic cross section of a device for bridging an electrical energy storage.

Various example embodiments are now described in more detail with reference to the accompanying drawings in which some embodiments are illustrated. In the figures, the thicknesses of lines, layers and/or regions may be exaggerated for clarity.

Accordingly, while example embodiments are capable of various modifications and alternative forms, embodiments thereof are shown by way of example in the drawings and will herein be described in detail. It should be understood, however, that there is no intent to limit example embodiments to the particular disclosed, but on the contrary, example embodiments are to cover all modifications, equivalents, and alternatives falling within the scope of the claims. Like reference numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprise", "comprising", "include" and/or "including," when used herein, specify the presence of stated features, integers, acts, operations, elements and/or components, but do not preclude the presence or addition of one or more other features, integers, acts, operations, elements, components and/or group thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 illustrates a device 10 for bridging an electrical energy storage according to an embodiment. The device 10 comprises a semiconductor substrate with a first doping region 3 arranged at a surface of the semiconductor substrate and a second doping region 4 adjacent to the first doping region 3. The first doping region 3 comprises a first conductivity type and the second doping region 4 comprises a second conductivity type. The p-n-junction between the first doping region 3 and the second doping region 4 is at least partially arranged less than 5 μm away from a contact area of the first doping region 3 arranged on the surface of the semiconductor substrate. The device further comprises a first contact structure 2 which is in contact with the first doping region 3 in the contact area of the first doping region 3, and comprises at least partially an electrically conductive material provided for a diffusion into the semiconductor substrate. The first contact structure 2 is implemented so that the electrically conductive material provided for a diffusion into the semiconductor substrate diffuses at least partially through the first doping region 3 into the second doping region 4 in case predefined trigger conditions occur. In addition, the device comprises a second contact structure 5 which is in contact with the second doping region 4 in a contact area of the second doping region 4.

By using the electrically conductive material—provided for a diffusion into the semiconductor substrate—in the contact structure of a thin doping region of a diode, the thin doping region may be at least partially short-circuited by alloying in case the predefined trigger conditions occur, and thus a low-resistance current path may be generated. Thus, a bridging element may be realized with a high degree of reliability and/or at a low cost.

For example, the semiconductor substrate may be a silicon substrate, a silicon carbide substrate or a gallium arsenide substrate.

For example, the surface or main surface of the semiconductor substrate is the interface between the semiconductor material of the semiconductor substrate and the adjoining insulator structures, insulator layers, metal structures, metal layers or passivation layers. The semiconductor substrate comprises a front side, and a backside essentially parallel thereto. The front side here is the side on which, for example, more complex structures are implemented or more complex processes executed than on the backside. The front side and the backside are essentially flat surfaces (e.g., neglecting manufacturing tolerances or trench structures).

The first doping region 3 may extend along a part of the surface or the entire surface of the semiconductor substrate (e.g., on the front side). Here, the first doping region 3 may extend, e.g., up to a maximum depth of 5 µm (or a maximum of 2 µm, a maximum of 1 µm, a maximum of 500 nm, a maximum of 250 nm or a maximum of 100 nm).

The second doping region 4 is adjacent to the first doping region 3. Due to the different conductivity types of the doping regions, a p-n-junction forms between the doping regions. Here, the depth of the p-n-junction depends, for example, on the depth of the first doping region 3. For example, the p-n-junction is thus arranged less than 5 µm (or less than 2 µm, less than 1 µm, less than 500 nm, less than 250 nm or less than 100 nm, e.g., 350 nm) from the contact area of the first doping region 3 arranged on the surface of the semiconductor substrate.

The second doping region 4 occupies at least a part of the part of the semiconductor substrate which is not occupied by the first doping region 3 or may extend across the entire part of the semiconductor substrate which is not occupied by the first doping region 3.

The second doping region 4 may, for example, comprise a basic doping concentration of the semiconductor substrate, or a dopant concentration which is increased by diffusion or implantation. E.g., an average dopant concentration (e.g., averaged across the second doping region) in the second doping region 4 may be higher than $1*10^{18}$ cm$^{-3}$ (or higher than $4*10^{18}$ cm$^{-3}$ or higher than $1*10^{19}$ cm$^{-3}$).

The first doping region 3 may be generated, for instance, by diffusion or implantation of dopants which form the first conductivity type in the semiconductor substrate. E.g., an average dopant concentration (e.g., averaged across the first doping region) in the first doping region 3 may be higher than $4*10^{18}$ cm$^{-3}$ (or higher than $1*10^{19}$ cm$^{-3}$ or higher than $4*10^{19}$ cm$^{-3}$).

The reverse voltage of the diode may, for example, be set by the doping concentrations in the doping regions.

The conductivity type of a doping region may result from an n-doping (e.g., by introducing nitrogen ions, phosphorus ions or arsenic ions) or a p-doping (e.g., by introducing aluminum ions or boron ions). For example, the first conductivity type is caused by an n-doping and the second conductivity type is caused by a p-doping, or vice-versa. Accordingly, the first doping region 3 is, for example, an n-doped region and the second doping region 4 is a p-doped region, or vice-versa.

By diffusing the electrically conductive material provided for a diffusion into the semiconductor substrate into the second doping region 4 in case the predefined trigger conditions occur, the p-n-junction is at least partially destroyed. This significantly reduces the resistance between the two contact structures, particularly in the reverse direction of the p-n-junction. E.g., the electrical resistance between the first and second contact structures is more than 1,000 times (or more than 10,000 times, more than 100,000 times or more than 1,000,000 times) greater prior to the occurrence of the predefined trigger conditions than after the occurrence of the predefined trigger conditions. For instance, the device 10 comprises a resistance of less than 100 mOhm/cm$^2$ (or less than 10 mOhm/cm$^2$) between the first and second contact structures after the occurrence of the predefined trigger conditions.

The first contact structure 2 may, for example, be a metal layer or a metal layer stack in direct contact with the first doping region 3 (e.g., also contactable directly from the outside via bond wires or soldered joints), or may extend to a pad (e.g., for contacting via bond wires or soldered joints) via one or several other metal layers which are insulated using insulating metal oxide.

The contact area of the second contact structure 5 may, for example, be arranged at a backside of the semiconductor substrate which faces the surface of the semiconductor substrate comprising the contact area of the first contact structure. For example, a vertical diode may thus be implemented. Alternatively, a lateral diode may also be implemented and the contact area of the second contact structure 5 may be arranged on the same side of the semiconductor substrate as the contact area of the first contact structure.

The electrically conductive material provided for a diffusion into the semiconductor substrate is, for example, a part of the metal layer which is in direct contact with the first doping region 3, or forms the metal layer which is in direct contact with the first doping region 3. A barrier layer (e.g., titanium or titanium nitride) may be arranged in between the semiconductor substrate and the electrically conductive material provided for a diffusion into the semiconductor substrate so that a diffusion may be suppressed prior to the occurrence of the predefined trigger conditions. Alternatively, the electrically conductive material of the first contact structure provided for a diffusion into the semiconductor substrate may be in direct contact with the first doping region 3 in the contact area of the first contact structure prior to the occurrence of the trigger conditions. Thus, a diffusion may, for example, be facilitated.

The electrically conductive material of the first contact structure provided for a diffusion into the semiconductor substrate may, for example, be a dopant resulting in the second conductivity type in the semiconductor substrate. In other words, the electrically conductive material of the first contact structure provided for a diffusion into the semiconductor substrate may, for example, be a material which may also be used for a doping of the second conductivity type. This allows, in the event of the diffusion into the first doping region 3, for the same to be at least partially converted into a region of the second conductivity type or for spikes of this material (spiking) to grow into the second doping region 4, and thus the first doping region 3 may be at least partially short-circuited by alloying. The electrically conductive material of the first contact structure provided for a diffusion into the semiconductor substrate may, for example, be aluminum, boron, gallium or indium, or an alloy of one of these materials. E.g., the electrically conductive material provided for a diffusion into the semiconductor substrate may be aluminum with a degree of purity of more than 95% (or more than 99% or more than 99.9%). For example, the electrically conductive material of the first contact structure provided for a diffusion into the semiconductor may comprise aluminum, and the second doping region 4 may comprise boron as a dopant. Thus, a doping with two different dopants of the same conductivity type may at least partially result following the diffusion into the second doping region 4.

Alternatively, the electrically conductive material of the first contact structure provided for a diffusion into the semiconductor substrate may be a material not forming any dopant in the semiconductor substrate. E.g., for this purpose, elements of the fourth main group (e.g., Si) or metals (e.g., nickel or titanium) which form a silicide together with silicon may be used.

The predefined trigger conditions may be specified using several parameters. For example, the trigger conditions may be specified by a predefined trigger current, a predefined trigger time and/or a predefined trigger temperature. For example, the predefined trigger conditions specify conditions under which the diffusion of the electrically conductive material of the first contact structure provided for a diffusion into the semiconductor substrate takes place quickly enough and in sufficient quantity into the second doping region 4 for the respective application in order to generate a sufficiently low-resistance current path.

The trigger temperature may, for example, be a temperature acquirable by the trigger current and the trigger time based on the operating temperature or room temperature.

In other words, the predefined trigger conditions may, for example, be acquired by a predefined trigger current between the first contact structure and the second contact structure 5 for a predefined trigger time. For instance, the trigger current may be between 0.1 A/mm$^2$ and 10 A/mm$^2$ (e.g., 0.5 A/mm$^2$, 1 A/mm$^2$ or 5 A/mm$^2$) The trigger time may, for example, be between 0.1 s and 10 s (or between 0.5 s and 5 s).

The diode formed on the semiconductor substrate may, for example, comprise a breakdown voltage which corresponds to 1.2 to 2 times the voltage of the energy storage to be bridged. E.g., the breakdown voltage of the diode may be between 4V and 10V (or between 5V and 6V).

The trigger current may, for example, be provided by battery elements which are coupled in series to a battery element to be bridged by the bridging element, or by a monitoring module (e.g., part of an energy management system).

The device 10 may, for example, also be referred to as a bridging element or inverse fuse, or may also comprise further components (e.g., contact elements, housing, monitoring module, plurality of bridging elements) alongside a bridging element, realized by the semiconductor diode or an inverse fuse.

The device 10 may bridge an energy storage (e.g., battery cell or accumulator cell) if the energy storage is, e.g., defective.

The doping and metallization of the semiconductor diode is, for example, implemented for being used as an inverse fuse in a battery (electrical energy storage)—e.g., a traction battery, e.g., lithium ion accumulators for an electric motor with an output voltage of approx. 400V and a maximum current strength of approx. 100 A. For example, the leakage current is below 100 gA/cm$^2$ prior to triggering. Following the triggering, a series resistance of less than 10 mOhm and/or 10 mOhm/cm$^2$ may be acquired. A possible set-up of a version of the diode is illustrated in FIG. 1. For example, FIG. 1 presents an inverse semiconductor fuse for bridging an accumulator cell.

For instance, the inverse semiconductor fuse 10 comprises a semiconductor substrate with a highly doped first semiconductor region (e.g., of silicon) 4 with a first doping type which also allows for a low-resistance short circuit in the event of incomplete short-circuiting by alloying of the entire semiconductor layer—for example, boron is used as the first doping type.

The semiconductor fuse 10 further comprises an even higher doped, second semiconductor area (e.g., of silicon) 3 on the first semiconductor region 4 with a second doping type so that a p-n-junction capable of blocking is formed; for example, area 3 is dimensioned so thin (e.g., between 100 nm and 5 μm or between 250 and 500 nm that short-circuiting by alloying is also made possible when triggering takes place with the lowest possible forward current density—accordingly, the second dopant type is, for example, phosphorus or arsenic.

In addition, the semiconductor fuse 10 comprises, for example, a metallization layer 2 of a material which (e.g., at temperatures beyond 400° C.) forms an alloy with the second semiconductor area 3 and serves as a first electrical terminal 7 and, when being short-circuited by alloying, forms a low-resistance (ohmic) contact in the first semiconductor region (wherein the first semiconductor region does not need to be fully short-circuited by alloying).

In a possible implementation for applications at room temperature (<150° C.), aluminum (with a degree of purity of more than 99.9%) is, for example, used as a contact material to the second semiconductor area 3. Alternatively, AlSi 1%—i.e. 99% pure Al with a Si portion—may also be used.

Other metals may also be used for higher operating temperatures (basically, other materials p-doped in silicon, such as boron, gallium, indium and thallium are also available as elements of the 3$^{rd}$ group of the periodic system for the set-up shown). A metal may be selected so that the eutectic point is clearly above the operating temperature when the alloy is formed so that the fuse is not solely triggered by the operating temperature.

In addition, a backside metallization 5 may be used which represents the second electric contact 8 and may, but does not need to, be alloyed as well when the bridging element is triggered. Alongside aluminum, for example, solderable layer stacks (e.g., of Cr/Ni/Ag or copper) or bondable layer stacks of an adhesive layer (TiN/TaN/Cr) and aluminum, AlSiCu or AlSi are also possible.

For triggering, the diode is operated, e.g., in the flow direction so that a sufficiently large trigger current (current density) can flow which results in short-circuiting by alloying.

The device may further be dimensioned in a way that it may also trigger in the event of the reverse current of the diode being too high in order to protect the battery against overcharging. E.g., a simple Schottky diode is not capable of ensuring this. In other words, the predefined trigger conditions can be acquirable both by a trigger current in the flow direction of the p-n-junction and by a trigger current in the reverse direction of the p-n-junction.

Optionally, an insulation/passivation layer 6, e.g., silicon dioxide or polyimide, may be used on the front side in order to limit the temperature decrease upon triggering and to thus ensure efficient short-circuiting by alloying with limited thermal energy.

After short-circuiting by alloying, in one possible implementation, two different dopants of the first dopant type are in the first semiconductor area close to the boundary area to the second semiconductor area (e.g., boron and aluminum) The diffused aluminum from the metallization layer 2 particularly constitutes the same dopant type as the boron present in the first semiconductor region 4. As a result, a low-resistance, ohmic (e.g., in contrast to a Schottky contact) contact is formed between these two areas after short-circuiting by alloying.

In a possible implementation, the semiconductor substrate 4 comprises a highly p-conducting (e.g., doped with boron) silicon substrate with a layer thickness of less than 500 μm (e.g., less than 200 μm). The dopant concentration is, for example, at about $10^{19}$ cm$^{-3}$.

The semiconductor area 3 may be implemented as a highly n-conducting layer, e.g., using ion implantation or diffusion of phosphorus or arsenic and may be doped higher than the semiconductor substrate 4, e.g., over $4*10^{19}$ cm$^{-3}$. The p-n-junction is here, for example, between 100 nm and 500 nm deep (corresponds to the extension of the semiconductor area 3). Patterning the semiconductor area 3 is not absolutely necessary. Separating the semiconductor devices by sawing through the p-n-junction is permissible, but may result in a higher leakage current in the non-triggered state. The insulation 6 is also not absolutely necessary, but by suitably selecting its geometry, it is possible to influence the location of the alloy and the temperature decrease during the alloying process.

Figure 2:
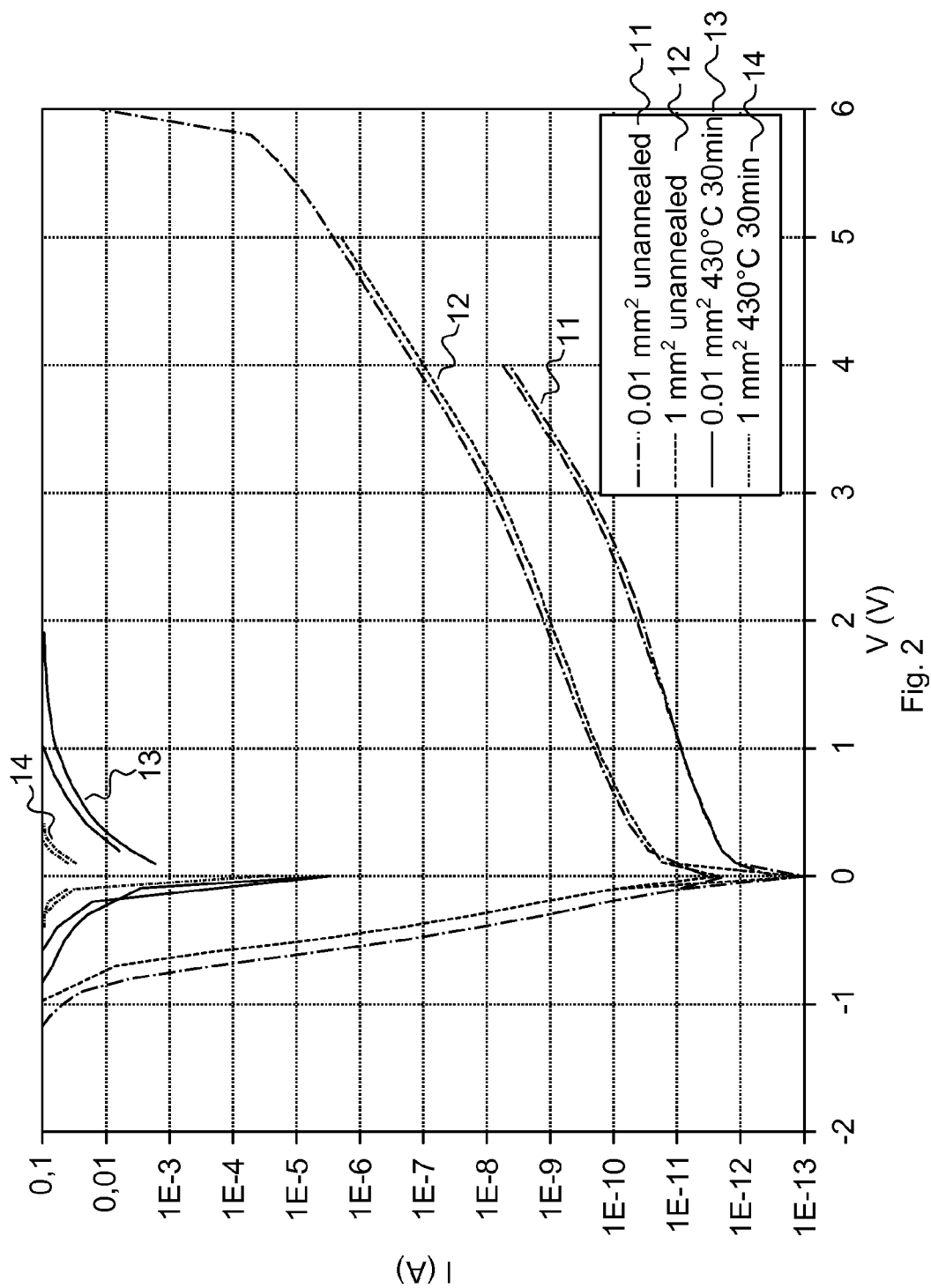
FIG. 2 illustrates a current-voltage diagram of a device for bridging an electrical energy storage prior to and after the occurrence of predefined trigger conditions.

In FIG. 2, current-voltage characteristics of such a fuse element are illustrated prior to and after the triggering.

In detail, FIG. 2 illustrates the current-voltage characteristics of the inverse semiconductor fuses on a p-doped first semiconductor area with an n-doped second semiconductor area prior to and after short-circuiting by alloying. Diode characteristics prior to triggering 11, 12 and a low-resistance, ohmic short circuit after short-circuiting by alloying 13, 14 are presented here in an exemplary manner. A trigger time of less than 10 s and a trigger temperature range between 400 and 750° C. were selected or assumed here.

Figure 3A:
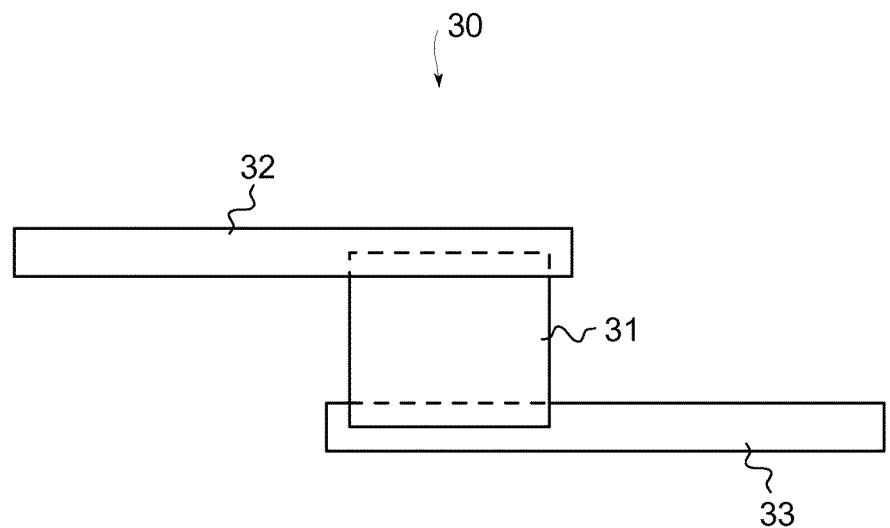
FIG. 3a illustrates a schematic top view on a device for bridging an electrical energy storage.
Figure 3B:
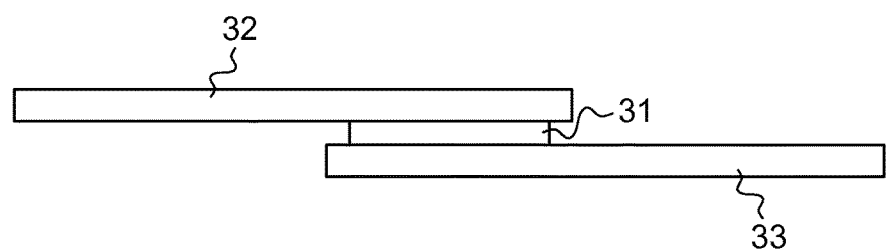
FIG. 3b illustrates a schematic side view of a device for bridging an electrical energy storage.

FIGS. 3a and 3b show a schematic representation of a device 30 for bridging an electrical energy storage according to an embodiment. The device 30 comprises a semiconductor diode integrated on a semiconductor chip 31 and a first electrically conductive contact element 32 which is connected to a first contact structure of the semiconductor diode on a front side of the semiconductor chip 31. The device 30 further comprises a second electrically conductive contact element 33 which is connected to a second contact structure of the semiconductor diode on a backside of the semiconductor chip 31. A contact area between the second electrically conductive contact element 33 and the backside of the semiconductor chip 31 extends here across less than 70% of the area of the backside of the semiconductor chip 31.

By reducing the contact area between the backside terminal of the bridging element, heat dissipation via the backside terminal can be significantly reduced. Thus, faster and greater temperature rise can be acquired using less current via the semiconductor diode. For example, in this way, the semiconductor diode may, in a simplified manner, be at least partially short-circuited by alloying and a low-resistance current path may be generated. Hence, the bridging element can be triggered in a simpler, faster and/or more reliable manner.

The semiconductor chip 31 may comprise a semiconductor diode manufactured in different semiconductor technologies (e.g., silicon, silicon carbide or gallium arsenide) and with different assemblies (e.g., PN diode, PIN diode, Schottky diode). The semiconductor chip 31 may further comprise the first and second contact structures.

The first electrically conductive contact element 32 makes an electric contact to the front side electrode or to one or several front side terminal pads of the semiconductor chip 31 which are formed by the first contact structure. For example, the first electrically conductive contact element leads out of a housing of the device in order to create an externally accessible terminal of the bridging element.

The second electrically conductive contact element 33 makes an electric contact to the backside electrode, or to one or several backside terminal pads of the semiconductor chip 31 which are formed by the second contact structure (e.g., full-area backside metallization). For example, the first electrically conductive contact element leads out of a housing of the device in order to create an externally accessible terminal of the bridging element.

The first electrically conductive contact element 31 and/or the second electrically conductive contact element 32 may be connected to the respective contact structure of the semiconductor chip 31 via, for example, a compression connection, a soldered joint or a bond. E.g., the first electrically conductive contact element 32 and/or the second electrically conductive contact element 33 may be an integral metal element which is connected to the respective contact structure of the semiconductor chip 31 by a soldered joint or a compression connection (e.g., pressed onto the semiconductor chip 31 by housing, which would, for example, again be removable in a non-destructive manner).

The contact area between the second electrically conductive contact element 33 and the backside of the semiconductor chip 31 (e.g., the contact area to the second contact structure) extends here across less than 70% (or less than 50%, less than 30%, less than 20% or less than 10%) of the area of the backside of the semiconductor chip 31. Thus, heat dissipation can significantly be reduced via the properly heat-conductive contact element so that the semiconductor chip 31 can be heated quicker or using less current.

Optionally, the contact area between the second electrically conductive contact element 33 and the backside of the semiconductor chip 31 is exclusively arranged in an edge area of the semiconductor chip 31, wherein the edge area of the semiconductor chip 31 extends from an edge of the semiconductor chip 31 up to a maximum of half (or a maximum of one third, one quarter, one fifth or one tenth) of a distance between edge and center of the semiconductor chip 31. Thus, heat dissipation in the center of the semiconductor chip may be significantly reduced.

Further, for example, a central area of the backside of the semiconductor chip 31 remaining next to the edge area may be exposed, be in contact with an electrically insulating structure, or be party exposed and partly in contact with an electrically insulating structure.

Figure 4:
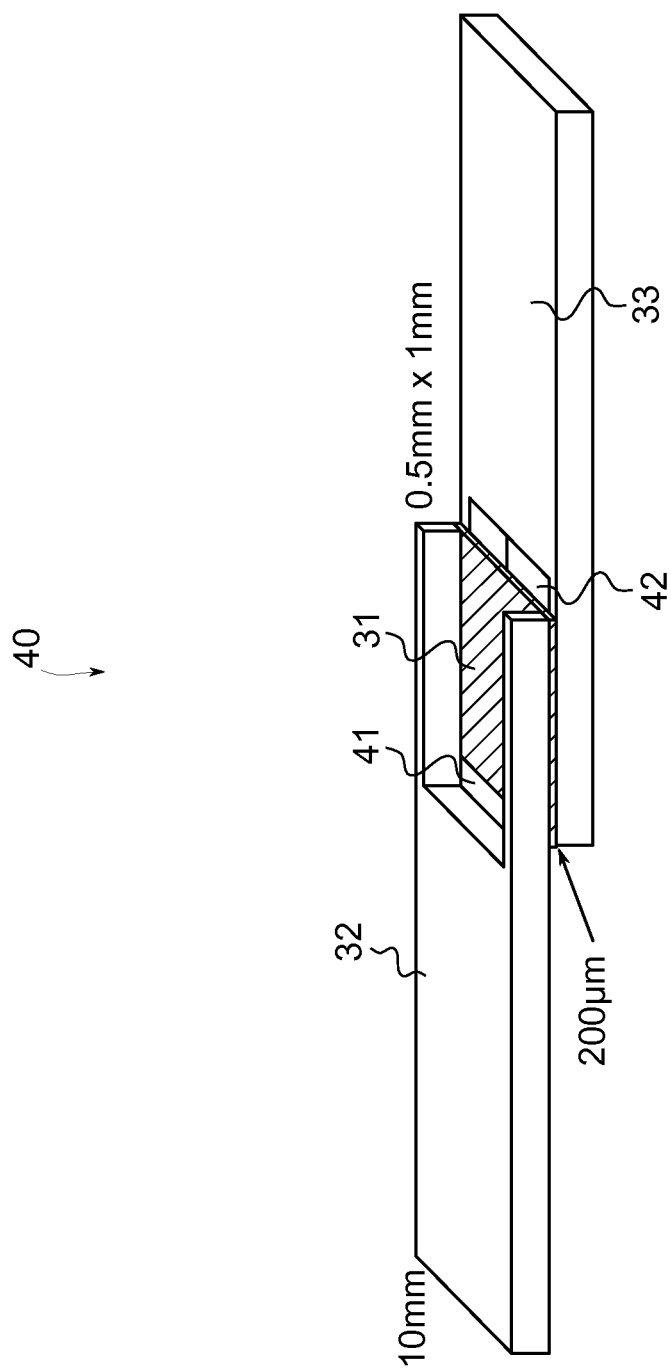
FIG. 4 illustrates a schematic, three-dimensional view of a device for bridging an electrical energy storage.

Optionally, the second electrically conductive contact element 33 may be in contact with the backside of the semiconductor chip 31 by at least two tines of a fork-shaped end of the second electrically conductive contact element (see, e.g., FIG. 4).

Further optionally, a contact area between the first electrically conductive contact element 32 and the front side of the semiconductor chip 31 may extend across less than 70% (or less than 50%, less than 30%, less than 20% or less than 10%) of the area of the front side of the semiconductor chip 31.

In an example, the contact area which is between the second electrically conductive contact element 33 and the backside of the semiconductor chip 31, and the contact area which is between the first electrically conductive contact element 32 and the front side of the semiconductor chip 31, may face each other symmetrically.

The semiconductor diode may be implemented, for example, according to the concept described above or according to any of the embodiments described above or below (e.g., FIG. 1).

More details of the device 30 (e.g., first contact structure, second contact structure and/or semiconductor diode) and/or additional optional aspects are illustrated in connection with the proposed concept, or one or several of the embodiments described above or below (e.g., FIG. 1).

For example, FIG. 4 shows another possible set-up of an inverse fuse using the semiconductor diode described above.

Figure 5:
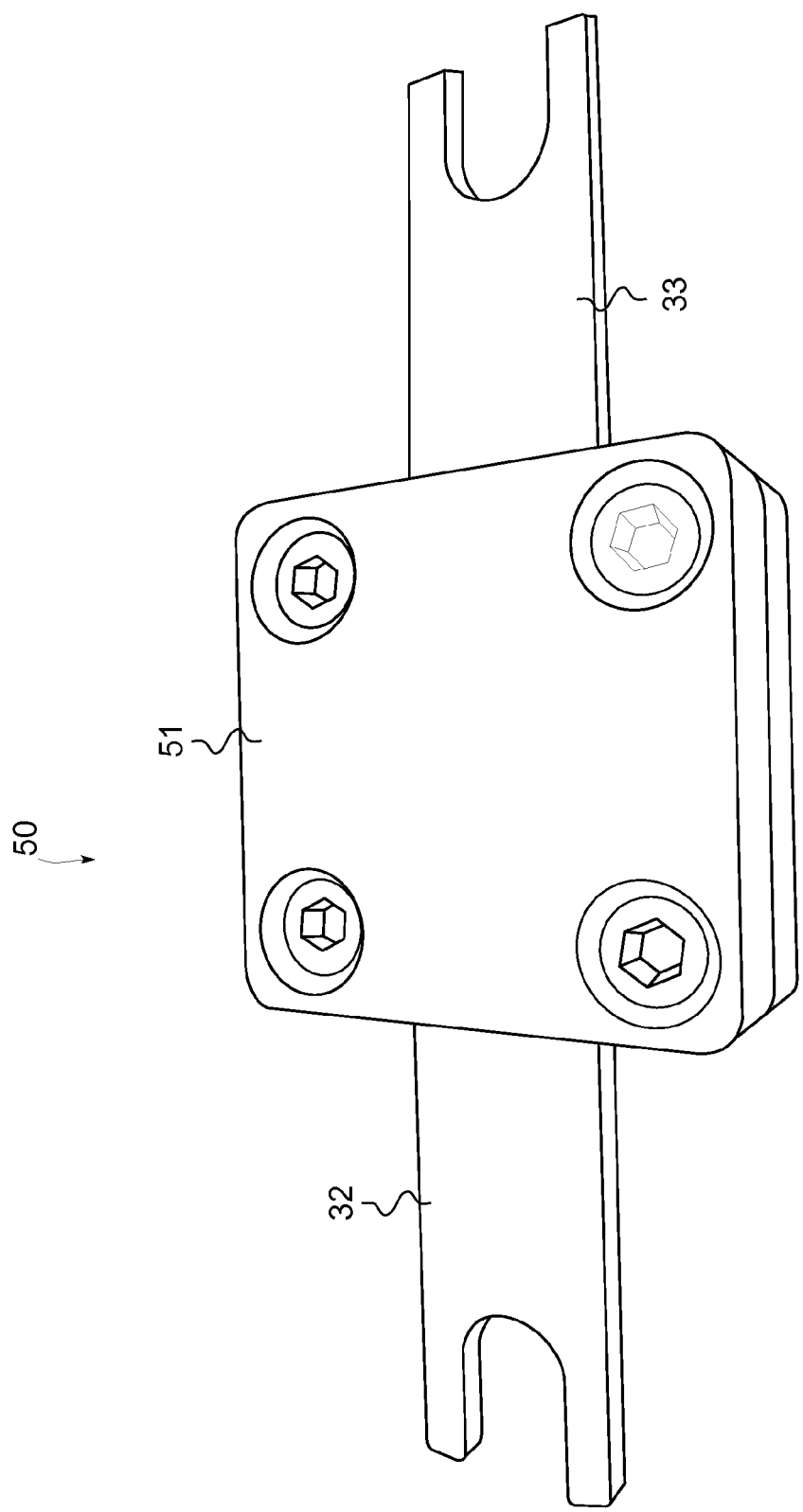
FIG. 5 illustrates a view of a housing of a device for bridging an electrical energy storage.

It should be taken into account here that, based on the set-up described below, the dissipation of power loss can be limited, as it occurs upon triggering. A possible contacting scheme and a corresponding housing 51 are illustrated in FIGS. 4 and 5. FIG. 4 shows here, for example, a contacting scheme for an inverse fuse and FIG. 5 shows an assembled fuse element (bridging element) in a housing 51 consisting of, e.g., K-Therm® AS 600 M or any other material.

Figure 6:
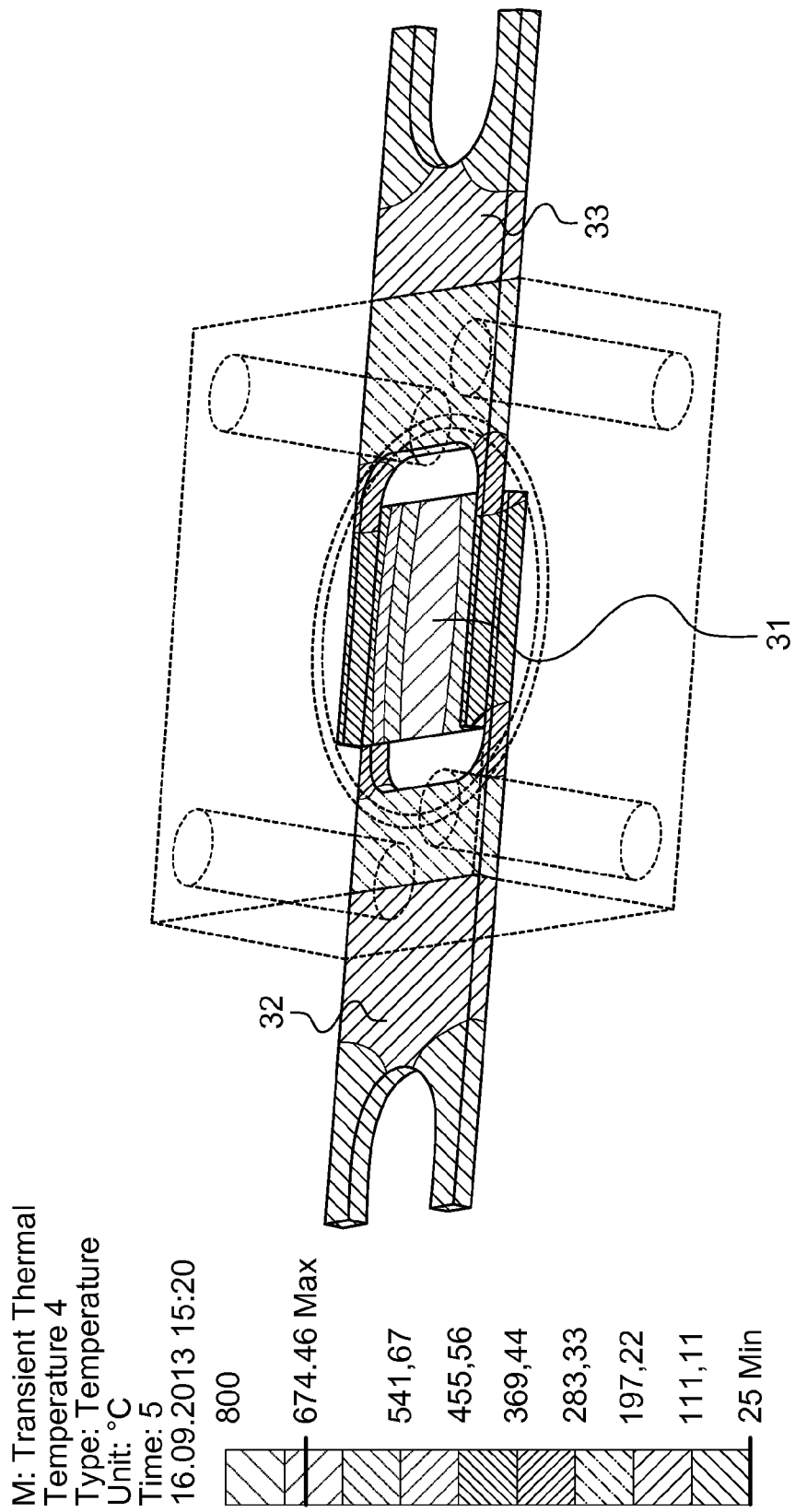
FIG. 6 illustrates a schematic, three-dimensional view of a device for bridging an electrical energy storage with simulated temperature distribution.

Due to the local positioning of the clamps at the edge of the device, heat dissipation in the center of the device may be hindered. Thus, it is possible to activate this inverse fuse in a shorter time using less energy (trigger current). The metal clamps may here be positioned in a way that the heat distribution may be significantly influenced. In this case, the metal clamps (contact element) are made of, e.g., aluminum. In another implementation, e.g., copper rails may be used. Furthermore, the outcome of a thermal simulation is shown in FIG. 6 for illustration purposes. FIG. 6 shows a simulated temperature distribution of the inverse fuse in the set-up, including the housing. Here, the housing is made of FR4 material, and a 200 µm thin silicon element is loaded for 5 s (corresponds to around 100 A current density, 100 A/cm$^2$ flow current) at a power of 70 W.

Thus, it was possible to reach the temperature of, e.g., more than 580° C. required for alloying the aluminum into silicon, at which short-circuiting by alloying may be acquired within approx. 10 s, on most of the chip area for a sufficiently long time.

The device described may be realized, e.g., with a very simple semiconductor component (p-n-junction), may be triggered without any external wiring (two-pole bridging element), may trigger without any external energy source and without any exothermic reaction and/or may be produced using a cost-effective manufacturing process (e.g., for a semiconductor device). Furthermore, a robust device may be implemented using a simple set-up technology and the high reliability of semiconductor devices (e.g., voltage cycles, voltage sustaining capability and ESD resistance) may be exploited. Moreover, the bridging element may take charge of the current flow in the event of strong overloading of the battery cell (Zener diode in the reverse direction) and thus provide an additional fuse function. For example, this fuse function may already be provided without triggering the bridging element (without destroying the p-n-junction). In addition, a low trigger current at which the device does not need to be fully short-circuited by alloying, may be used. The reverse voltage of the Zener diode may be set, for example, by the doping concentrations in the doping regions.

Some embodiments relate to a bridging element on a semiconductor basis and a process of manufacture for the element and a device for setting up the bridging element.

The suggested concept is based on a semiconductor diode and a housing to be used as a bridging element. The bridging element is, for example, self-triggering and features, e.g., only two poles.

In the following, the reliability of energy storage packages in electric vehicles is considered in more detail in an exemplary manner. In electric, but also in hybrid vehicles, energy storage packages provide, for example, a voltage in the range of around 400V. This high voltage may be required to maintain the current at an acceptable value, such as at 200 A, which is required in order to supply the electric drive(s). Therefore, the energy storage package may comprise several modules each of which comprises series-connected energy storage cells, e.g., batteries, accumulators, capacitors, super-caps. In some energy storage packages which use, for example lithium ion battery cells, in order to acquire the 400V referred to above, it may be required to connect around 100 of these lithium ion battery cells in series, wherein each of the cells provides around 2.3V-4.2V. Their limited reliability over a longer period of time may be a problem of these energy storage packages, something that is to be attributed to the large number of series-connected cells. If a cell fails, it constitutes a high-resistance path, such as a no-load operation, for the power path so that the entire energy storage package is no longer able to provide the power required by the electric drive to move the vehicle. In this example, the reliability of the vehicle directly depends on the weakest cell within the energy storage package.

Figure 7:
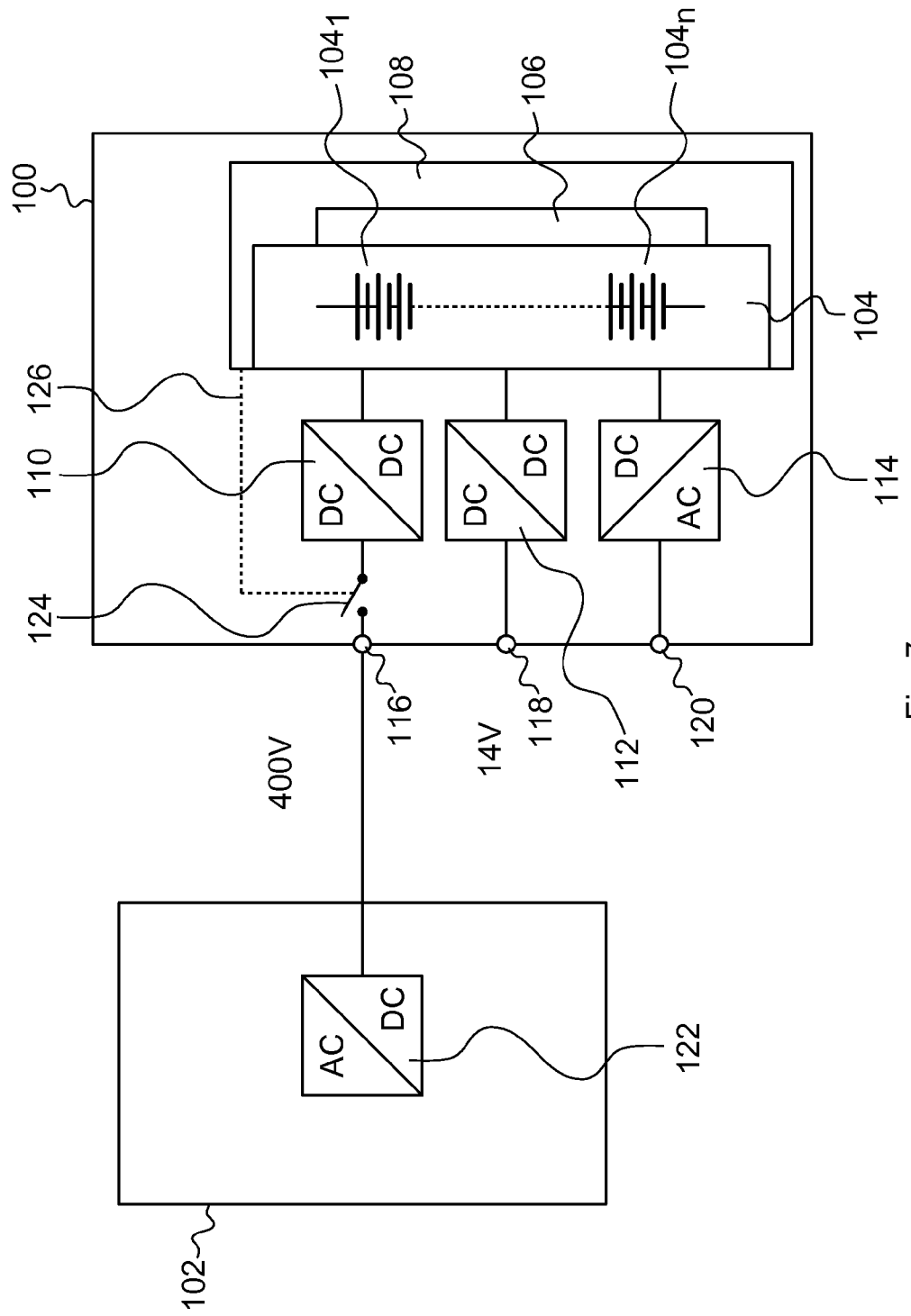
FIG. 7 illustrates an energy storage package which is coupled to an electric drive, as used for example in an electric vehicle.

This problem is described below with reference to FIG. 7. FIG. 7 shows an energy storage package 100 which is coupled to an electric drive 102, as used for example in an electric vehicle. The energy storage package 100 comprises a battery block 104 which comprises a plurality of series-connected battery cells 104$_1$ to 104$_n$. In addition, a compensation circuit 106 is provided in order to ensure a consistent loading state of the individual cells 104$_1$ to 104$_n$. The battery block 104 further comprises a battery monitoring and battery handling unit 108 which is provided for monitoring the function of the battery block 104 during operation. The energy storage package 100 further comprises a first DC-DC converter 110 and a second DC-DC converter 112 which are connected to the battery block 104. Furthermore, an inverter 114 is provided which is connected to the battery block 104 as well. The first DC-DC converter 110 is implemented in order to provide a voltage of 400V at a first output 116 of the energy storage package 100. The second DC-DC converter 112 is provided in order to provide a voltage of 14V at a second output 118. The inverter 114 provides an AC voltage at a third output 120. In the example illustrated in FIG. 1, the first input 116 of the energy storage package 100 is connected to the electric drive 102 which in turn comprises an inverter 122 in order to provide an AC voltage at the output 116 for the operation of the electric drive 102 based on the DC voltage provided by the energy storage package 100. In the example shown in FIG. 7, a switch 124 between the first DC-DC converter 110 and the output 116 is further arranged in the energy storage package 100 which is connected to the circuit 108 of the battery block 104 via a control line 126. This switch may be provided in order to separate the output 116 from the DC-DC converter 110 in the event of no connected element being recognized at the output 116 by the circuit 108. If the circuit 108 recognizes that an element, e.g., the drive 102, is connected to the output 116, the switch 124 is closed by outputting a corresponding control signal via line 126.

Alongside the reliability requirements referred to above, safety aspects must also be taken into account in connection with energy storage packages for electric vehicles. In an energy storage package which comprises a plurality of battery cells, overheating of one of the battery cells may occur for various reasons. This has the effect that their separator which is typically made of a plastic is destroyed or melts. In the worst case, this may result in a short circuit between the two electrodes of the battery cell. Internal short circuits may also arise due to dendritic or crystal growth at the electrodes, for instance, if the battery cell was overcharged. Unfortunately, external circuits do not offer any protection against such internal short circuits—it can only be achieved within the battery cell itself. However, once an internal short circuit has occurred, there is not much that can be done using external measures in order to protect the battery cell. An occurrence of such a short circuit may, for example, be detected by sensing a sudden drop in cell voltage. This detection may be exploited to trigger a breaker which separates the battery from the rest of the package.

However, internal short circuits occur rarely as various separators have been developed in the meantime which avoid this problem.

A type of separators which is used in battery cells is a so-called "shutdown separator". In lithium ion battery cells, as used in the automotive sector, shutdown separators or shutdown separating elements are used which are irreversibly activated within a narrow temperature range between 120° degree centigrade and 140° degree centigrade, something that results in a sudden increase in series resistance of the battery cell. In other types of battery cells, the irreversible interruption may be caused by a current interruption device or a thermal fuse. All these protection mechanisms cause a circuit interruption effect which results in the impedance of a battery cell increasing up to several hundreds of kilo-ohms. This means that the high-current path which extends through the energy storage package to the electric drive comprises an increased resistance. This is described below with reference to FIG. 8.

Figure 8:
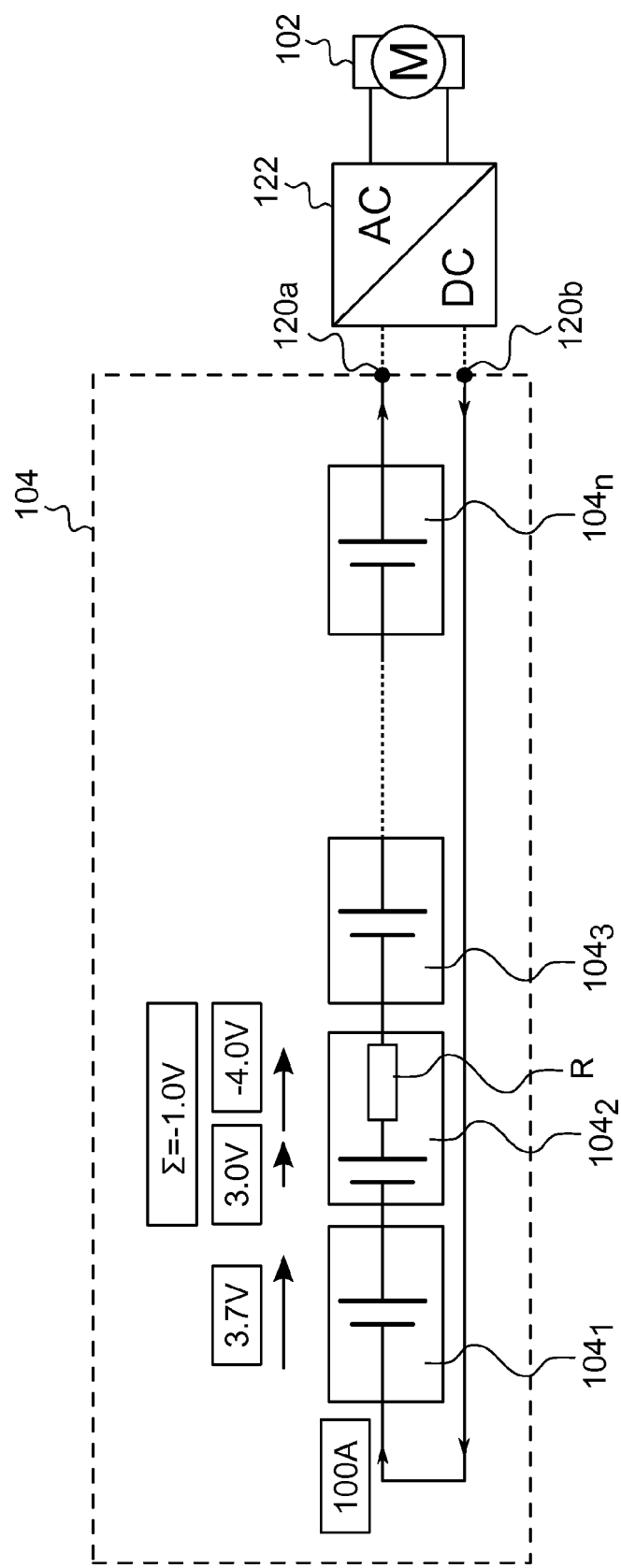
FIG. 8 illustrates an energy storage package, similar to the one described with reference to FIG. 7.

In FIG. 8, an energy storage system similar to the one described with reference to FIG. 7 is illustrated, wherein the batteries used comprise shutdown separators. In the event of overheating of a battery cell, the shutdown separator leads to an increase in the series resistance which results in a no-load operation which furthermore results in the current path being interrupted and in it being no longer possible to supply the electric drive. FIG. 8 is a schematic representation of the battery block 104 which comprises the majority of battery cells $104_1$, $104_2$, $104_3$ ... $104_n$. The energy provided by the batteries 104 serves to supply an electric drive 102, wherein the energy provided by the batteries is converted into an AC voltage by means of the inverter 122 in order to operate the motor 102. The battery cells $104_1$ to $104_n$ are connected in series and output the direct power to the inverter 122 at an output 120a. The inverter 122 is further connected to another input 120b of the battery block 104. In the example shown in FIG. 8, lithium ion batteries are used, wherein it is assumed that, with the exception of the battery cell $104_2$ all other battery cells operate properly. The battery cells are equipped with a shutdown separating element and/or a shutdown separator as explained above. In the defective battery cell $104_2$, the shutdown separator is activated due to overheating which results in an increase in the internal resistance of the battery $104_2$ as illustrated schematically by resistance R. This leads to the fact that, instead of the voltage provided by a normally operating battery which amounts to around 3.7V, due to the increase in series resistance of the battery element $104_2$ the battery turns from an energy source into an energy consumer. The battery cell $104_2$ still provides around 3.0V, however, the increased series resistance of this cell results in a voltage drop of around 4.0V so that, overall, a voltage across the cell $104_2$ drops (around 1V). With an increasing series resistance R of the weak battery cell $104_2$, its temperature rises as well since the inverter 122 acts as a current sink in the event of an acceleration of the motor 102, and acts as a current source in a deceleration process of the motor, wherein, in this case, the energy is fed back into the battery block 104 via the terminal 120b.

In the example illustrated in FIGS. 7 and 8, alongside one or several of the battery cells $104_1$, $104_2$, $104_3$ ... $104_n$, one or several bridging elements may be implemented in parallel according to the proposed concept, or according to one or several of the embodiments referred to above. By using a proposed device for bridging an electrical energy storage, the operational safety and/or reliability of the energy storage package or the battery module may be enhanced.

To resolve the issue of a battery cell failure described above with reference to FIG. 8, for example, an electrical power element may be introduced, the so-called power antifuse (inverse fuse), or a bridging element may be introduced according to the described concept or any of the embodiments. The inverse fuse or the bridging element may allow to subject series-connected power elements, such as energy sources in the form of batteries, accumulators, capacitors, super/ultra capacitors, solar cells or fuel cells, to a hard short-circuit in case of an error. FIG. 9 illustrates series-connected energy sources with bridging power elements or bridging elements which subject a defective energy source to a hard short circuit in case of an error so that a connected energy consumer may continue to be supplied with electricity, wherein FIG. 9(a) shows a number of energy sources which are all in normal operation, and FIG. 9(b) presents a situation in which one of the energy sources is defective.

Figure 9B:
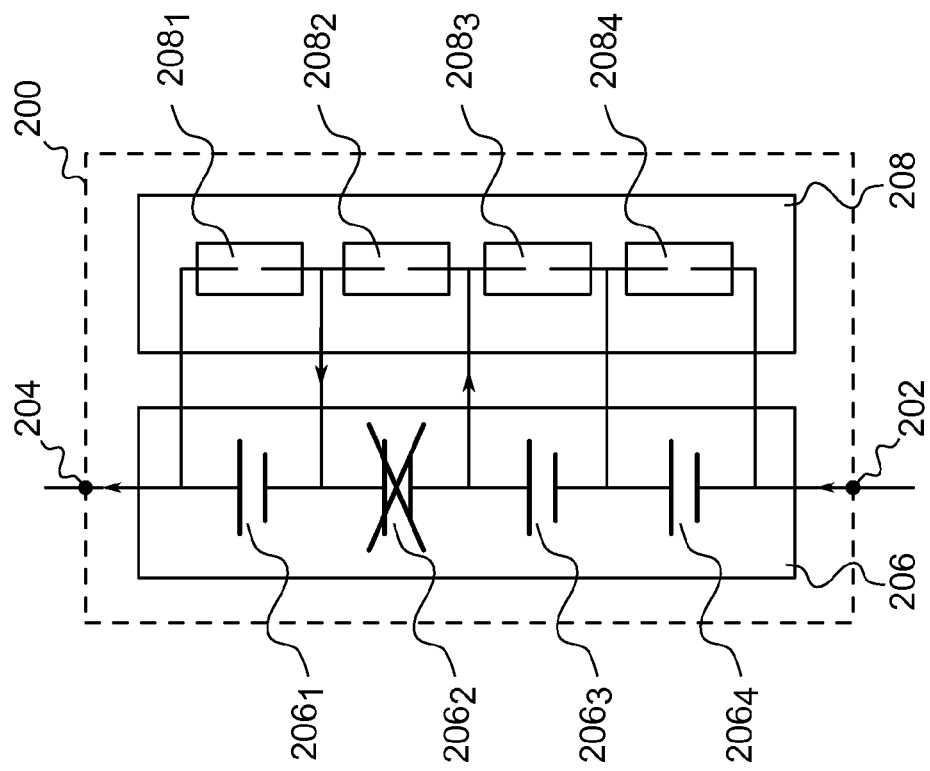
FIG. 9(b) presents a situation in which one of the energy sources is defective.
Figure 9A:
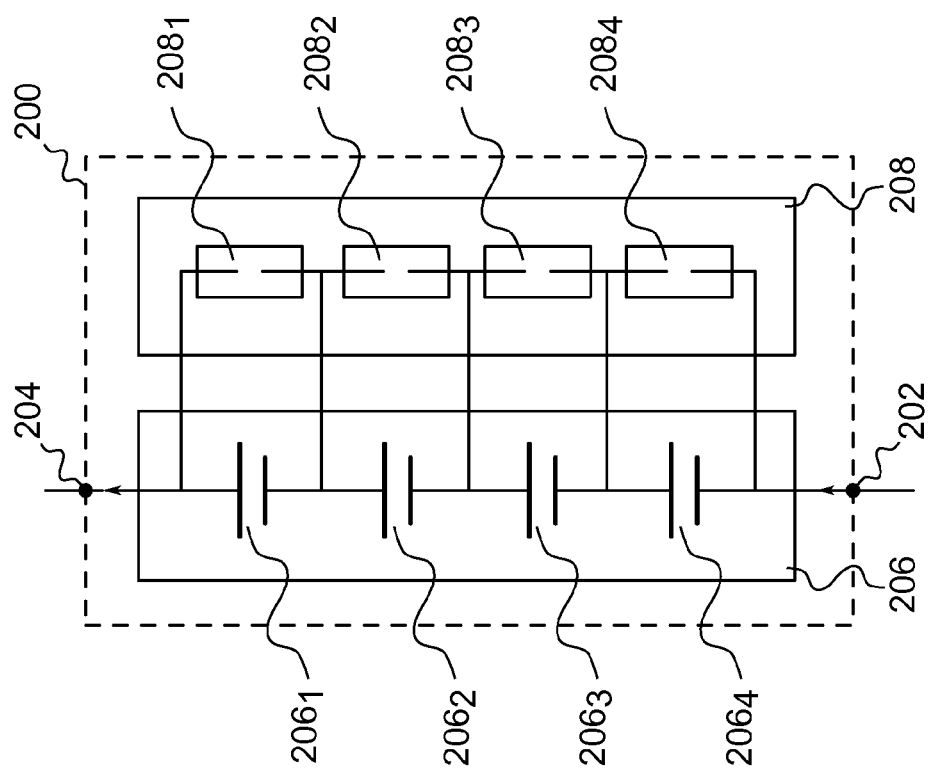
FIG. 9(a) presents a number of energy sources, which are all in normal operation.

FIG. 9(a) shows a battery block 200 which comprises a first terminal 202 and a second terminal 204. A series circuit 206 of a plurality of battery cells $206_1$ to $206_4$ is shown between the terminals 202 and 204. A power path is defined by the series-connected batteries $206_1$ to $206_4$ between the terminals 202 and 204, wherein the series-connected batteries are also referred to as stacked cells. The battery block 200 further comprises a fuse block 208 with a plurality of inverse fuse elements or bridging elements $208_1$ to $208_4$, wherein each of the inverse fuse elements or bridging elements comprises two terminals, a first terminal of which is connected to a first terminal or a first pole of a battery cell, and a second terminal of which is connected to a second terminal and a second pole of the corresponding battery cell. The inverse fuse elements or bridging elements $208_1$ to $208_4$ are associated with the respective battery cells $206_1$ to $206_4$ and, as shown in FIG. 9(a), one inverse fuse element is each connected in parallel to one or several battery cells which are connected in series or in parallel. FIG. 9(a) shows the situation in which all batteries are in normal operation so that none of the inverse fuse elements or bridging elements is activated. The deactivated state of the fuse elements $208_1$ to $208_4$ is illustrated by a broken line in the circuit symbol in FIG. 9(a).

FIG. 9(b) shows a situation in which the battery cell $206_2$ is defective. Such a faulty operation of the memory cell $206_2$ results in the polarity at the corresponding terminals of the battery cell being reversed when a sufficiently high load current flows. This voltage reversal causes an activation of the associated inverse fuse element or bridging element $208_2$ (e.g., the element is triggered in case predefined trigger conditions occur, wherein reverse-polarity voltage is now applied at its terminals as well, as is schematically illustrated by the continuous line in element $208_2$ in FIG. 9(b). The other elements remain in their inactive state. As illustrated by the arrows in FIG. 9(b), the power path now extends from terminal 202 across the battery cells $206_4$ and $206_3$ through the element $208_2$, and across the battery cell $206_1$ to the second terminal 204.

The generated low-resistance short circuit can avoid the failure of the entire system and can allow the further operation in a deteriorated or reduced mode, until the next maintenance. Basically, all kinds of systems which require a series circuit of energy sources and thus comprise a critical current path, the interruption of which results in the failure of the entire system, may benefit from the inverse fuse or a bridging element according to the proposed concept or any of the embodiments, which, as mentioned, enhance the reliability and availability of the entire system. By using the inverse fuse or the bridging element, the failure probability of the entire system is, for example, no longer equal to the sum of failure probabilities of the individual energy sources. Using additional, series-connected energy sources such as further battery cells, a redundant overall system can be created by means of the inverse fuse or the bridging element.

For example, two versions exist for an inverse fuse and a bridging element, a so-called untriggered version and a so-called triggered version. For example, the untriggered version operates without any additional control signals and merely comprises the two power terminals required for the connection to the element to be bridged. The triggered version may be triggered by an additional control signal and comprises, for example, an additional control input.

Figure 10:
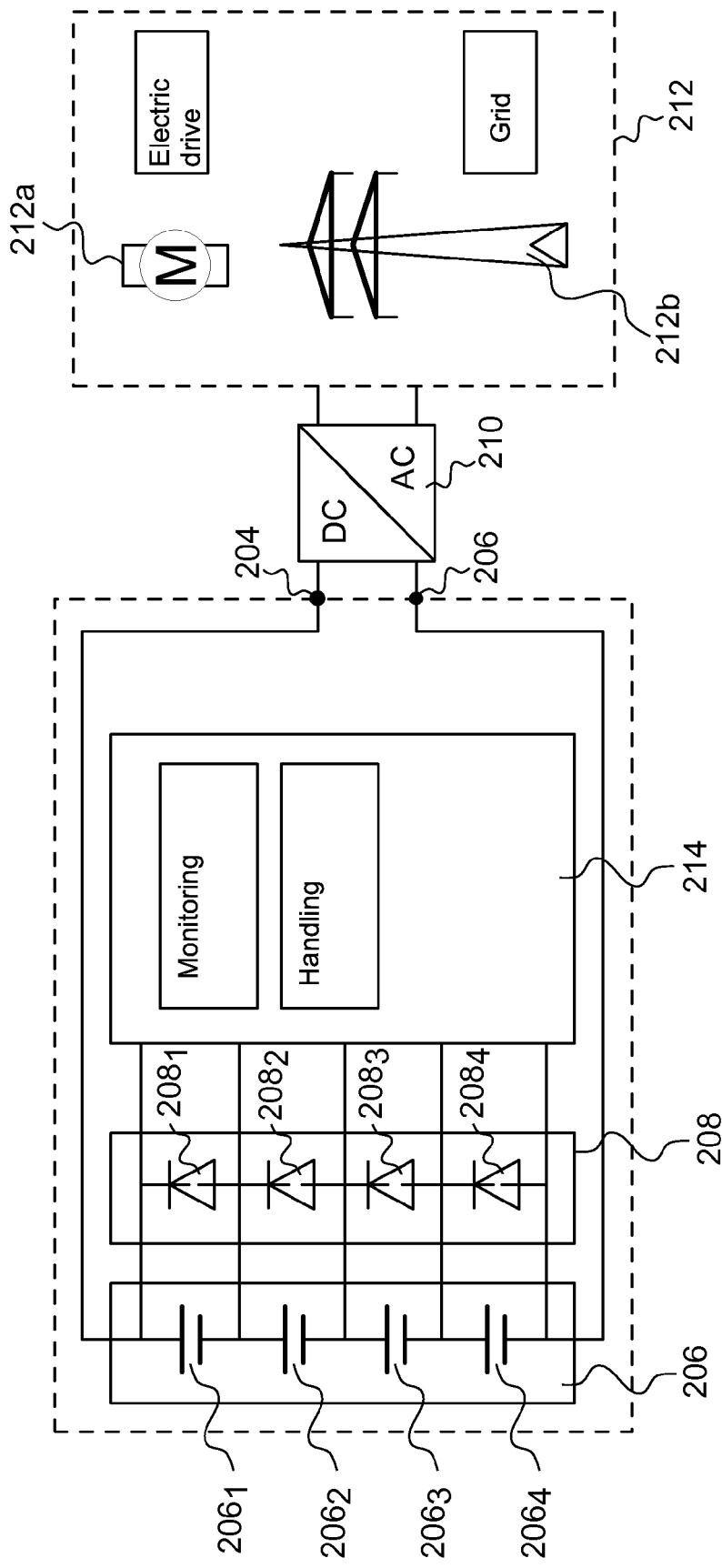
FIG. 10 illustrates a system which comprises inverse fuses.

With reference to FIG. 10, a system is described which comprises inverse fuses or bridging elements, wherein an inverse fuse of a cell is activated if the cell voltage is reversed during discharge due to an increasing internal cell resistance, a state which may arise in battery blocks as described above with reference to FIG. 8. FIG. 10 shows the battery block 200 with the terminals 202 and 204 to which a bidirectional inverter 210 is connected which provides alternating power to the electrical load 212 schematically illustrated in FIG. 10. The electrical load 212 shown in FIG. 10 comprises, for example, an electric drive or electric motor 212a or a power grid 212b into which an alternating power is to be fed. In addition to the series circuit 206 of the battery cells $206_1$ to $206_4$, the battery block comprises a battery monitoring and battery handling system 214. Furthermore, the inverse fuse elements and/or bridging elements $208_1$ to $208_4$ are shown in FIG. 10 which are connected in parallel to the corresponding battery cells and are all in the deactivated state as shown by the broken line in the circuit symbol. The monitoring circuit 214 is connected to each of the parallel circuits comprising a battery cell and a bridging element, and, alongside the conventional known functions, allows monitoring which determines which of the cells is defective in order to provide a respective indication which facilitates maintenance.

In order to bridge a defective cell without significantly increasing the costs of the entire battery block, an inverse fuse or a bridging element may be used according to the proposed concept, which is considered to be a device which essentially acts like an open state if it was not activated, and which comprises a low impedance and/or a short circuit with a high current capacity if it was activated, wherein the element, when being activated, changes from the open state into the short-circuit state on a non-recurring and irreversible basis, i.e., for example, a transition back into the open state is not possible. The proposed inverse fuse allows, for example, a dynamic reconfiguration of battery blocks in case of a defective cell. Without the inverse fuse elements, the current path (see, for example, FIG. 8) would be interrupted and the electrical load could no longer be supplied with energy.

Thus, one aspect creates a concept comprising the inverse fuse which short-circuits the defective cell in a stack in order to remove it from the power/current path so that, by applying such a solution, the entire system is still able to operate and to supply a load with energy and/or current.

The battery cells $206_1$ to $206_4$ shown in FIG. 10 use internal short-circuit protection mechanisms, such as a shutdown separator, which are irreversibly activated if the battery cell overheats. This prevents the battery cell from exploding and the neighboring cells from being damaged. If the shutdown separator was activated due to a short circuit which was caused by the activated inverse fuse, the defective battery cell acts like a highly resistive resistor in the power path. By using the inverse fuse element, however, the inverter 210 continues to be able to feed energy to the load 212 from the remaining healthy battery cells, after the defective cell was bridged by means of the inverse fuse as described with reference to FIG. 9.

The joint monitoring and handling circuit 214 of all batteries exists, for example, for energy storage packages for electric vehicles. The monitoring system monitors the voltage of each cell. If a cell indicates a suspicious voltage, this is recognized by the system so that maintenance is facilitated or the corresponding bridging element is actively triggered.

For example, a high resistance of the inactive, inverse fuse may be required for the trouble-free operation of the accumulator cells in normal operation in order to avoid self-discharging of the battery cells via the inverse fuse. In contrast, in outage operation, for example, a forward resistance of the triggered, inverse fuse being too high would limit the maximum current too much, which can be drawn from the remaining cells (approx. 100 A to 200 A) and, furthermore, considerable effort would be required to dissipate the thermal power loss (approx. 10 W maximum power loss in the inverse fuse). Embodiments create, for example, an inverse fuse which comprises a difference of resistance of some orders of magnitude between outage operation and normal operation. This may be required as an abrupt dissipation of the remaining energy of a cell incorrectly identified as being defective might result in overheating of and damage caused to the neighboring cells due to the high energy loss.

Due to the high current strengths which occur in electrical energy storages for stationary and transport systems, the inverse fuse may be installed as close as possible to the respective cell so that the inverse fuse may be manufactured in the form of an integrated device for a realization requiring minimized installation space. The inverse fuse may be dimensioned such that the electrical performance of the device housing is taken into account and the required current carrying capacity is furthermore ensured.

According to one aspect, an inverse fuse or a bridging element may be manufactured according to the proposed concept which can be manufactured in a cost-effective manner and activates itself in case of an error, and can then be exchanged together with the defective accumulator cell. To manufacture the inverse fuses, integral device technologies may be used, wherein the inverse fuse may comprise a diode function, which means that the current can only flow in one direction in normal operation. This diode function is connected antiparallel to the cell to be bridged as shown with reference to FIG. 10 (see the diode symbol used therein). In the event of an error, this diode function is destroyed by a non-recurring current flow in forward direction so that the diode function becomes a bidirectional, symmetrical, low-resistance short circuit. For example, this destruction of the diode function may be achieved by the fact that the layer and/or the layers, which define the diode function, short-circuit by alloying and form the short circuit due to the non-recurring current flow.

For example, the diode function may be a junction diode, e.g., a p-n-junction, a Schottky diode, e.g., a semiconductor-metal junction, or other structures which are unidirectional for the current flow. The diode function may be realized by various methods, such as, in thin-film technology, by printable electronics, by sputtering and the like.

According to one aspect, to realize the inverse fuse, use may be made of the metal spiking phenomenon, such as the aluminum spiking, which causes short-circuiting by alloying and allows a very low-resistance short circuit in the triggered state.

According to embodiments in which short-circuiting by alloying should already take place at low temperatures, it can, for example, be provided to mix and use metal alloys in a eutectic.

A proposed inverse fuse may, for example, comprise the performance of a current switch which comprises a very low leakage current in the open state (if the current is transported via the functioning cell), and which comprises a very low power loss in the closed state (if the current is transported through the inverse fuse via a defective cell). For example, systems having series-connected cells, e.g., energy sources such as batteries, accumulators, capacitors, super/ultra capacitors, solar cells and fuel cells, can acquire a redundancy by inserting inverse fuses antiparallel to the energy sources. It may be avoided to insert redundant cells into the system, whereby additional system costs can be saved. Complex circuits for a dynamic reconfigurability of the system can be avoided so no additional costs are incurred either as the inverse fuse is able to self-trigger.

Even after a failure of several cells, the system can still operate in a reduced mode or a degraded mode. According to embodiments, the failed cells short-circuited by the inverse fuses may be recognized by existing systems such as the aforementioned monitoring system, wherein weak cells may already be short-circuited by an inverse fuse at an early stage as the inverse fuse can be designed accordingly.

Compared to conventional, active semiconductor devices, the proposed fuse may be less expensive and, in the conducting state, may have a clearly lower cell resistance than conventional, active semiconductor devices. Compared to other active semiconductor devices, the process of manufacture is noticeably simpler and failure mechanisms, which should usually be avoided in semiconductor devices such as the aforementioned aluminum spiking, may be used in a controlled manner to trigger the inverse fuse.

It can be achieved via the triggered inverse fuse that no (or only a negligible) voltage drop occurs so that essentially only the losses resulting from the contact resistances exist. A possible threshold voltage which is given by the diode function does, for example, no longer exist in the triggered state. E.g., in the triggered state, the occurring short circuit for the current is furthermore low-resistant and bidirectional due to the inverse fuse, i.e., symmetrical, and a diode function is no longer given.

The trigger mechanism is, for example, thermo-metallurgical and irreversible, and the heat required for triggering is drawn from the remaining energy of the cell to be short-circuited or is taken from the healthy cells by a current source/sink, e.g., the inverter in FIG. 10. Furthermore, the inverse fuse may be integrated in cells, e.g., during the manufacture in the battery cell/battery package, such as in combination with a shutdown separator.

Furthermore, the activated element may allow charging of the series-connected batteries due to its bi-directionality present in the triggered state.

Figure 11B:
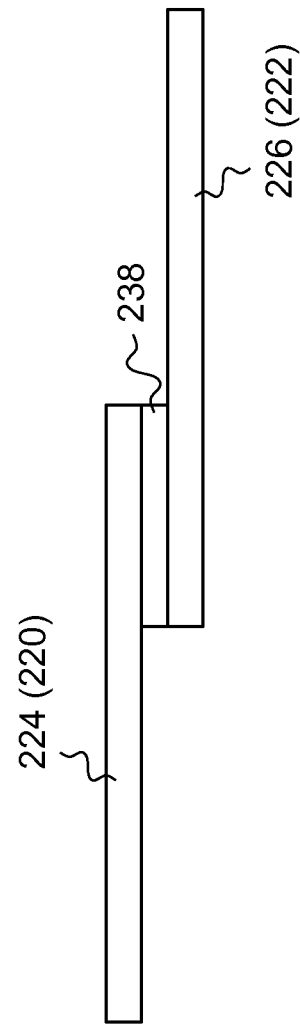
FIG. 11(b) presents a schematic representation of a set-up of an inverse fuse.
Figure 11A:
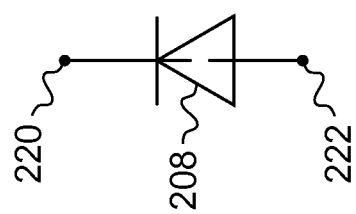

FIG. 11 presents a schematic representation of an inverse fuse according to an embodiment of the invention. FIG. 11(a) shows the symbols used in FIGS. 9 and 10 for the inverse fuse 208 in the non-triggered state, something that is schematically indicated by the broken line in FIG. 11(a) within the circuit symbol. The inverse fuse element 208 comprises a first terminal 220 and a second terminal 222. According to embodiments, the first terminal 220 is a first power terminal which, for example, is provided for a connection to a positive cell electrode and/or a positive pole of a battery cell. The second terminal 222 is a second power terminal which, for example, is provided for a connection to a negative cell electrode and/or the negative pole of a battery cell.

FIG. 11(b) presents a schematic representation of the set-up of an inverse fuse according to embodiments. The inverse fuse 208 is a multilayered element which comprises a first metal layer 224 and a second metal layer 226. An element 238 is arranged between the metal layers 224 and 226 which provides a diode function in normal operation which, when triggering the element 208, is converted into a permanent (irreversible) conductive connection. The element 238 may comprise one or several current-barrier layers, wherein the diode function realized hereby and present in normal operation is irreversibly cleared in the event of a reversal of polarity between the metal layers 224 and 236, i.e., the element 238 changes irreversibly into a low-resistance state. The metal layers 224 and 238 form the first and second terminals 220 and 222 of the inverse fuse element 208 which are illustrated in FIG. 11(a), and are connected to the aforementioned corresponding terminals of a battery and/or an energy source.

As can be seen from FIG. 11, the proposed inverse fuse element comprises the two power terminals 220(224) and 222(226), such as in the form of metal electrodes. Due to the unit 238 arranged between the metal electrodes 234 and 236 in the form of one or several layers, two stable states of the fuse element are acquired, that is, a first state in which both power terminals 220 and 222 are separated from one another under high resistance and/or a second state in which the two power terminals 220 and 222 are short-circuited. As can be seen from FIG. 11, additional signal terminals can be avoided. The trigger mechanism may be of an electrical, thermal or metallurgical nature, for example, the second stable state may be caused by the aforementioned aluminum spiking or by other metals into which the semiconductor dissolves at higher temperatures.

A diode function may be provided by the element 238 in the first state, such as by a PN or PIN junction, a Schottky contact or the like. Furthermore, it may additionally be provided to provide for a semiconductor substrate and/or a carrier such as a silicon wafer, a silicon carbide wafer, a GaAs wafer, to realize the diode function. The arrangement shown with reference to FIG. 11 may be produced, for example, using a thin film technology, using a printing process, using a CMOS processing or the like. One of the power terminals and/or one of the metal layers 224, 226 may be used as a carrier during the processing of the element 238 to realize the diode function.

The element 238 may be realized using organic and/or inorganic materials, wherein the organic materials comprise, for example, polymers, small molecules or low-molecular compounds. The inorganic materials may comprise semiconductors, such as silicon, silicon carbide, GaAs, GaN and the like.

For example, one aspect relates to a device for bridging an energy source which provides a voltage between two terminals in normal operation, wherein a voltage between the terminals is reversed in case of an error. The device comprises an element which is switchable between the terminals of the energy source, wherein the element is configured and interconnectable in order to provide a high-resistance connection between the terminals of the energy source or the energy consumer when the voltage is applied in normal operation, and in order to provide a bidirectional, symmetrical, permanent and low-resistance connection between the terminals of the energy source or the energy consumer when the reversed voltage is applied in case of an error.

Furthermore, an aspect refers to a method for bridging an energy source or an energy consumer which provides a voltage between two terminals in normal operation, wherein a voltage between the terminals is reversed in case of an error. When the voltage is applied in normal operation, the method comprises providing a high-resistance connection between the terminals of the energy source or the energy consumer, and, when the reverse voltage is applied in case of an error, generating a bidirectional, permanent and low-resistance connection between the terminals of the energy source or the energy consumer.

Some examples further relate to an energy source or an energy consumer with a first terminal, a second terminal, wherein a voltage is applied between the two terminals in normal operation, and wherein a voltage between the terminals is reversed in case of an error, and a device according to embodiments which is connected between the first terminal and the second terminal.

Furthermore, embodiments provide a method with at least two series-connected energy sources or energy consumers according to embodiments.

According to further embodiments, the device comprises a first terminal and a second terminal, wherein the element is arranged between the first terminal and the second terminal, wherein the element is configured to provide the high-resistance connection between the first terminal and the second terminal when a first voltage is applied between the first and second terminals, and to provide the bidirectional, permanent and low-resistance connection between the first and second terminals when a second voltage reversed to the first voltage is applied between the first and second terminals, and wherein the first terminal and the second terminal are connectable to the terminals of the energy source or the energy consumer such that the voltage of the energy source or of the energy consumer is applied as a first voltage between the first and second terminals in normal operation, and that the reversed voltage is applied as a second voltage between the first and second terminals at the energy source or the energy consumer in case of an error.

According to embodiments, the element may be configured to allow a unidirectional current direction and/or to provide a diode function which enables a high-resistance connection when the voltage is applied in normal operation, and which is destroyed due to the flowing current in case of an error when the reversed voltage is applied and is converted into a bidirectional, symmetrical, low-resistance short circuit. In this case, the element may comprise one or several patterned or unpatterned layers in order to provide the diode function, wherein the flowing current causes short-circuiting by alloying in case of an error so that the short circuit occurs. The element may be configured to enable a metal spiking (e.g., an aluminum spiking) to enable acquiring the short-circuiting by alloying, whereby the short circuit is at a very low resistance. Alternatively, the element in a eutectic may comprise mixed metal alloys in order to already acquire short-circuiting by alloying at low melting temperatures. The diode function may be realized using a junction diode, a Schottky diode or another structure which is unidirectional for the current flow.

According to one aspect, the device can be triggered without external control signals.

The voltage applied in normal operation has a first polarity, and the voltage applied in case of an error has a polarity opposite to the first polarity, wherein the voltage applied in normal operation and the voltage applied in case of an error may have different values.

The energy source may comprise a battery, an accumulator, a capacitor, a super/ultra capacitor, a solar cell or a fuel cell.

Embodiments create, for example, a fuse element which can be manufactured in a cost-effective manner, can carry currents of over 100 A in the active state and comprises a series resistance of less than 1 mΩ and which activates itself in case of an error without requiring an excess voltage at the monitored device.

The integration of a power antifuse in parallel to each cell may be easy to implement, whereby the reliability and lifetime of the overall energy package, e.g., in electric vehicles, can be dramatically extended. Furthermore, this may allow not only to provide a very cost-effective solution to enhance the reliability of the energy storage package, but the already existing developments in the field of monitoring and handling of energy packages, such as in connection with battery monitoring and battery handling systems, are used as well.

For example, embodiments relate to a bridging element for accumulator cells in mobile and stationary applications which, for example, comprise lithium ion cells. A defective lithium ion accumulator cell comprises a high series resistance in the electric circuit and thus increases the power loss in the entire system. If this series resistance is too large, this defective accumulator cell consumes a considerable amount of energy as a power loss. This may result in overheating or a fire, in the worst case even to the explosion of the entire high-performance energy storage. In order to remedy this safety-relevant issue, the defective accumulator cell must be isolated from the energy storage without interrupting the electric circuit in the entire system. This isolation may be achieved, for example, by short-circuiting the terminals and/or plus and minus poles by means of a proposed inverse fuse which demonstrates high resistivity in normal operation and low resistivity in outage operation. The current does then no longer flow via the defective accumulator cell, but via the inverse fuse which comprises a low resistance in the outage operation, which may be in the order of, or below, the internal resistance of the intact accumulator cell. Through this, the energy loss and the arising heat generation are kept within acceptable and safe limits in case of an error. By using a proposed inverse fuse, it can be guaranteed that damaged, defective or failed cells in the system are protected against overheating. Moreover, the system may event operate in a slightly deteriorated or degraded mode in the event of a breakdown, i.e., by using one or several isolated accumulator cells and/or triggered inverse fuses, enough energy is still provided which allows operation of the entire system, such as of a drive. When used in motor vehicles, it is also possible to hereby ensure in the event of the failure of one or several cells in the battery block that the affected motor vehicle can be independently taken to the next garage. The reliability of stationary systems, such as photovoltaic stand-alone solutions, may also benefit from a proposed inverse fuse.

In case of a repair of the defective system, it is, for example, no longer required to exchange the entire energy storage, but it is sufficient to exchange the accumulator cells recognized as defective which have usually already been recognized by the monitoring system.

Figure 12:
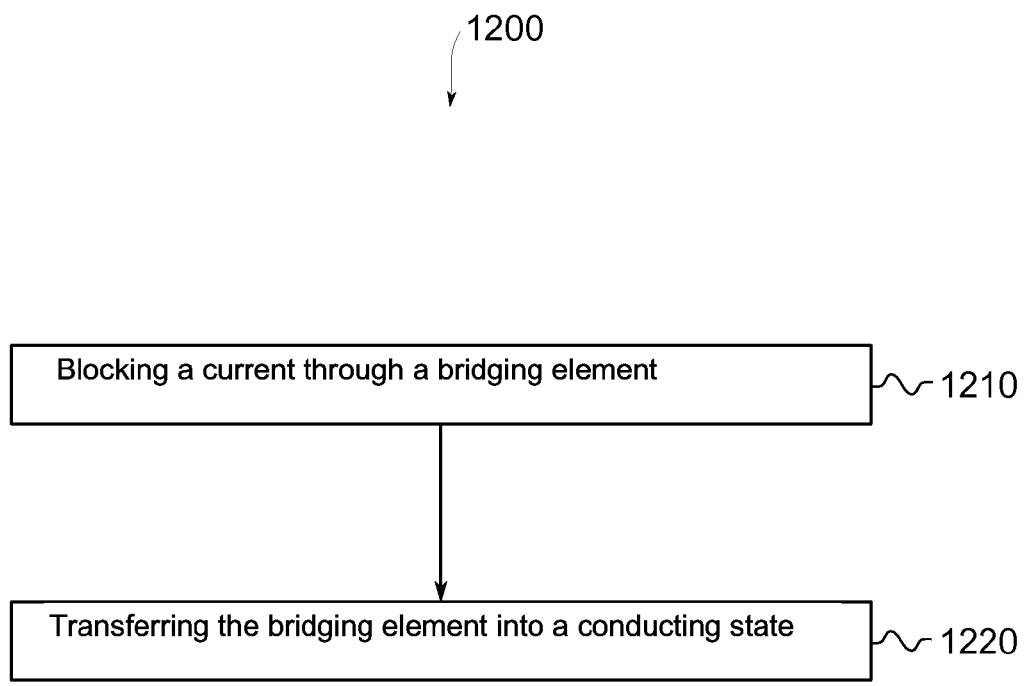
FIG. 12 presents a flowchart of a method for bridging an electrical energy storage.

FIG. 12 shows a flow chart of a method 1200 bridging an electric energy storage according to an embodiment. The method 1200 comprises blocking 1210 a current flow through a bridging element which comprises a semiconductor substrate with a first doping region arranged at a surface of the semiconductor substrate, and a second doping region adjacent to the first doping region. The first doping region comprises a first conductivity type and the second doping region comprises a second conductivity type, wherein the p-n-junction between the first doping region and the second doping region is at least partially arranged less than 5 μm away from a contact area of the first doping region arranged at the surface of the semiconductor substrate. The bridging element comprises a first contact structure, at least partially provided for a diffusion into the semiconductor substrate and comprising electrically conductive material, which is in contact with the first doping region in the contact area of the first doping region. The method 1200 further comprises transferring 1220 the bridging element into a conducting state in case predefined trigger conditions occur by at least partially diffusing the electrically conductive material, provided for a diffusion into the semiconductor substrate, through the first doping region into the second doping region.

By using the electrically conductive material provided for a diffusion into the semiconductor substrate in the contact structure of a thin doping region of a diode, the thin doping region may be at least partially short-circuited by alloying when the predefined trigger conditions occur, and thus a low-resistance current path may be generated. Thus, a bridging element may be realized with a high degree of reliability and/or at a low cost.

The method may comprise one or more additional optional acts corresponding to one or more aspects mentioned in connection with the described concept or one or more embodiments described above.

Some embodiments relate to a method for manufacturing a device for bridging an electrical energy storage according to the described concept or one or several of the embodiments described above.

The embodiments may further provide a computer program having a program code for executing one of the above methods, when the computer program is executed on a computer or processor. A person of skill in the art would readily recognize that acts of various above-described methods may be executed by programmed computers. Herein, some embodiments are also intended to cover program storage devices, e.g., digital data storage media, which are machine or computer readable and encode machine-executable or computer-executable programs of instructions, wherein the instructions execute some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to execute the acts of the above-described methods or (field) programmable logic arrays ((F)PLAs) or (field) programmable gate arrays ((F)PGAs), programmed to execute the acts of the above-described methods.

The description and drawings merely illustrate the principles of the disclosure. It will thus be appreciated that those skilled in the art will be able to devise various arrangements that, although not explicitly shown herein, embody the principles of the disclosure and are included within the spirit and scope of the invention. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to also include features of a claim in any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub-acts. Such sub-acts may be included or be part of the disclosure of this single act unless explicitly excluded.

The research that led to these results was supported by the European Union.

What is claimed is:

1. A device for bridging an electric energy storage, comprising:
   a semiconductor substrate with a first doping region arranged at a surface of the semiconductor substrate and a second doping region adjacent to the first doping region, wherein the first doping region comprises a first conductivity type and the second doping region comprises a second conductivity type, wherein a p-n-junction between the first doping region and the second doping region is at least partially arranged less than 5 µm away from a contact area of the first doping region arranged at the surface of the semiconductor substrate;
   a first contact structure which is in contact with the first doping region in the contact area of the first doping region and comprises at least partially an electrically conductive material provided for a diffusion into the semiconductor substrate, wherein the first contact structure is configured so that the electrically conductive material provided for a diffusion into the semiconductor substrate diffuses at least partially through the first doping region into the second doping region in case predefined trigger conditions occur; and
   a second contact structure which is in contact with the second doping region in a contact area of the second doping region.

2. The device of claim 1, wherein an electrical resistance between the first and the second contact structures is more than 1,000 times greater prior to the occurrence of the predefined trigger conditions than after the occurrence of the predefined trigger conditions.

3. The device of claim 1, wherein the electrically conductive material of the first contact structure provided for a diffusion into the semiconductor substrate is a dopant producing the second conductivity type in the semiconductor substrate.

4. The device of claim 1, wherein the electrically conductive material provided for a diffusion into the semiconductor substrate is aluminum having a degree of purity of more than 95%.

5. The device of claim 1, wherein the p-n-junction is arranged between 100 nm and 500 nm away from the contact area of the first doping region arranged on the surface of the semiconductor substrate.

6. The device of claim 1, wherein the predefined trigger conditions are met by a trigger current between the first contact structure and the second contact structure for a trigger time.

7. The device of claim 6, wherein the trigger current is between 0.1 A/mm$^2$ and 10 A/mm$^2$.

8. The device of claim 6, wherein the trigger time is between 0.1 s and 10 s.

9. The device of claim 6, wherein the trigger current is provided by battery elements which are coupled in series to a battery element to be bridged by the bridging element, or the trigger current is provided by a monitoring module.

10. The device of claim 6, wherein the predefined trigger conditions are reachable by both a trigger current in the flow direction of the p-n-junction and a trigger current in the reverse direction of the p-n-junction.

11. The device of claim 1, wherein an average dopant concentration in the first doping region is higher than $4*10^{18}$ cm$^3$.

12. The device of claim 1, wherein an average dopant concentration in the second doping region is higher than $1*10^{18}$ cm$^{-3}$.

13. The device of claim 1, wherein the contact area of the second contact structure is arranged on a backside of the semiconductor substrate opposite to the surface of the semiconductor substrate comprising the contact area of the first contact structure.

14. The device of claim 1, wherein the electrically conductive material of the first contact structure provided for a diffusion into the semiconductor substrate is in direct contact with the first doping region prior to the occurrence of the trigger conditions in the contact area of the first contact structure.

15. The device of claim 1, further comprising:
   a semiconductor diode integrated on a semiconductor chip;
   a first electrically conductive contact element which is connected to a first contact structure of the semiconductor diode on a front side of the semiconductor chip; and
   a second electrically conductive contact element which is connected to a second contact structure of the semiconductor diode on a backside of the semiconductor chip, wherein a contact area between the second electrically conductive contact element and the backside of the semiconductor chip extends across less than 70% of the area of the backside of the semiconductor chip.

16. The device of claim 15, wherein the contact area between the second electrically conductive contact element and the backside of the semiconductor chip is exclusively arranged in an edge area of the semiconductor chip, wherein the edge area of the semiconductor chip extends from an edge of the semiconductor chip up to a maximum of half a distance between the edge and a center of the semiconductor chip.

17. The device of claim 16, wherein a central area of the backside of the semiconductor chip remaining next to the edge area is exposed, is in contact with an electrically insulating structure, or is partly exposed and partly in contact with an electrically insulating structure.

18. The device of claim 15, wherein the second electrically conductive contact element is in contact with the backside of the semiconductor chip by at least two tines of a fork-shaped end of the second electrically conductive contact element.

19. The device of claim 15, wherein a contact area between the first electrical conductive contact element and the front side of the semiconductor chip extends across less than 70% of the area of the front side of the semiconductor chip.

* * * * *